(12) United States Patent
Hirashima et al.

(10) Patent No.: US 7,385,279 B2
(45) Date of Patent: Jun. 10, 2008

(54) SEMICONDUCTOR DEVICE AND A METHOD OF MANUFACTURING THE SAME

(75) Inventors: Toshinori Hirashima, Takasaki (JP);
Munehisa Kishimoto, Kamakura (JP);
Toshiyuki Hata, Maebashi (JP);
Yasushi Takahashi, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/642,523

(22) Filed: Dec. 21, 2006

(65) Prior Publication Data
US 2007/0158819 A1   Jul. 12, 2007

Related U.S. Application Data

(60) Continuation of application No. 10/932,074, filed on Sep. 2, 2004, now Pat. No. 7,160,760, which is a continuation of application No. 10/265,324, filed on Oct. 7, 2002, now Pat. No. 6,812,554, which is a division of application No. 09/502,826, filed on Feb. 11, 2000, now Pat. No. 6,479,888.

(30) Foreign Application Priority Data

Feb. 17, 1999   (JP)   .................................... 11-38124
Dec. 28, 1999   (JP)   .................................... 11-372510

(51) Int. Cl.
*H01L 23/495* (2006.01)
*H01L 23/48* (2006.01)
*H01L 23/52* (2006.01)

(52) U.S. Cl. ...................... 257/666; 257/787; 257/673; 257/693

(58) Field of Classification Search ................ 257/693, 257/666, 787, E23.031
See application file for complete search history.

(56) References Cited

U.S. PATENT DOCUMENTS

| 4,996,583 | A | 2/1991 | Hatada |
| 5,103,290 | A | 4/1992 | Temple et al. |
| 5,105,536 | A | 4/1992 | Neugebauer et al. |
| 5,648,682 | A | 7/1997 | Nakazawa et al. |

(Continued)

FOREIGN PATENT DOCUMENTS

JP   60-138944   7/1985

(Continued)

*Primary Examiner*—Nitin Parekh
(74) *Attorney, Agent, or Firm*—Mattingly, Stanger, Malur & Brundidge, PC

(57) ABSTRACT

A semiconductor device and method having high output and having reduced external resistance is reduced and improved radiating performance. A MOSFET (70) has a connecting portion for electrically connecting a surface electrode of a semiconductor pellet and a plurality of inner leads, a resin encapsulant (29), a plurality of outer leads (37), (38) protruding in parallel from the same lateral surface of the resin encapsulant (29) and a header (28) bonded to a back surface of the semiconductor pellet and having a header protruding portion (28c) protruding from a lateral surface of the resin encapsulant (29) opposite to the lateral surface from which the outer leads protrude, wherein the header (28) has an exposed surface (28b) exposed from the resin encapsulant (29); the outer leads (37), (38) are bent; and the exposed of the outer leads (37), (38) are provided at substantially the same height.

3 Claims, 25 Drawing Sheets

U.S. PATENT DOCUMENTS

| | | | |
|---|---|---|---|
| 6,249,041 B1 * | 6/2001 | Kasem et al. | 257/666 |
| 6,268,651 B1 | 7/2001 | Hellgren et al. | |
| 6,307,755 B1 * | 10/2001 | Williams et al. | 361/813 |
| 6,566,164 B1 | 5/2003 | Glenn et al. | |
| 6,650,004 B1 | 11/2003 | Horie et al. | |
| 6,707,138 B2 * | 3/2004 | Crowley et al. | 257/676 |

FOREIGN PATENT DOCUMENTS

| | | |
|---|---|---|
| JP | 1-122143 | 5/1989 |
| JP | 2-133951 | 5/1990 |
| JP | 5-121615 | 5/1993 |
| JP | 8-64634 | 3/1996 |
| JP | 9-129798 | 5/1997 |

* cited by examiner

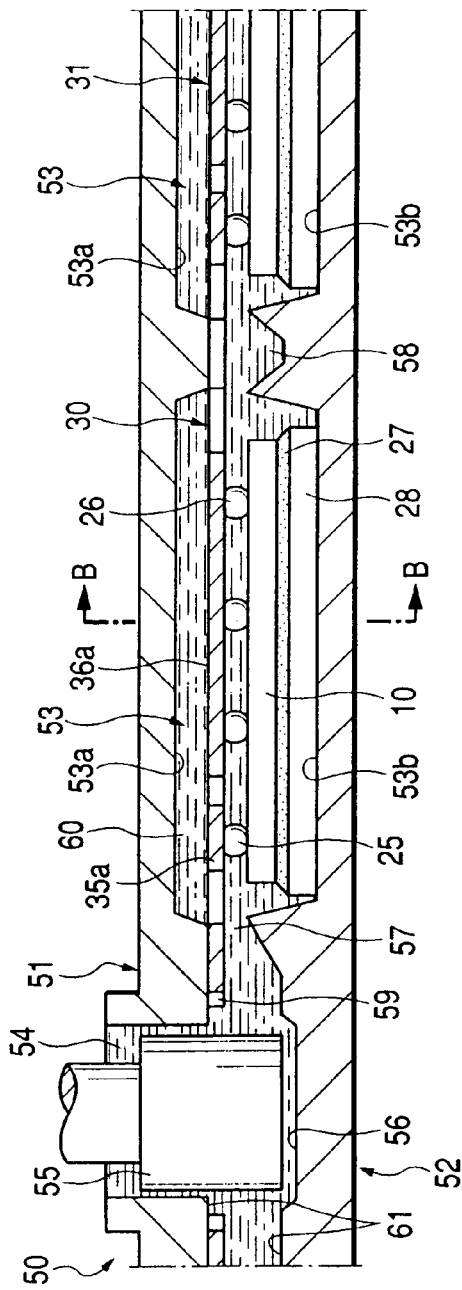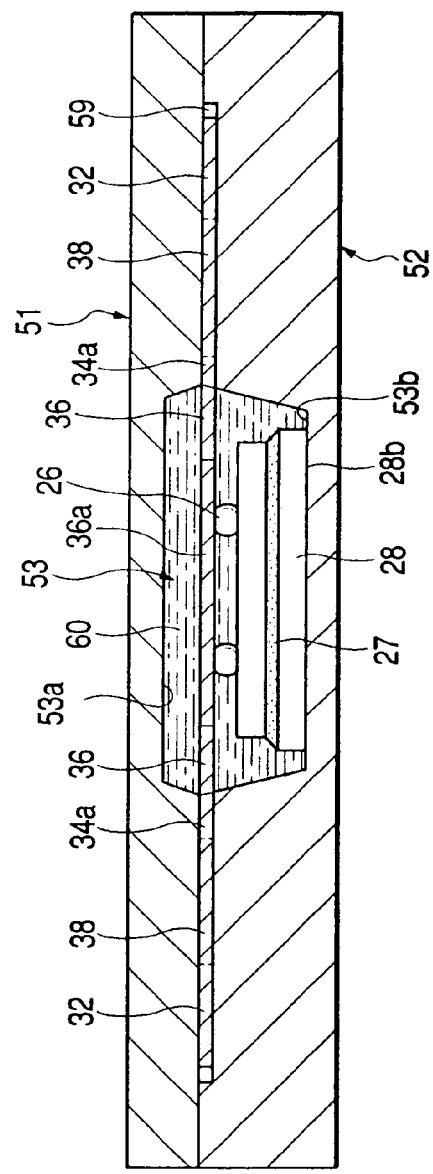

SEMICONDUCTOR DEVICE AND A METHOD OF MANUFACTURING THE SAME

CROSS-REFERENCES

This is a continuation application of U.S. Ser. No. 10/932,074 (now U.S. Pat. No. 7,160,760), filed Sep. 2, 2004, which is a continuation application of U.S. Ser. No. 10/265,324, filed Oct. 7, 2002 (now U.S. Pat. No. 6,812,554), which is a divisional application of U.S. Ser. No. 09/502,826, filed Feb. 11, 2000 (now U.S. Pat. No. 6,479,888).

BACKGROUND OF THE INVENTION

1. Field of the Invention

The present invention relates to a semiconductor manufacturing technique and, more particularly, to a technique which is advantageously applied to high output MOSFETs (metal oxide semiconductor field effect transistors).

2. Description of the Prior Art

According to a study made by the inventor, exemplary semiconductor devices that generate high output and high heat include transistors referred to as "MOSFETs" which are used in electronic and electric apparatuses in all fields including power supplies and switches of battery-driven apparatuses, car electronics and controllers for driving motors.

An example of such MOSFETs that generate high output and high heat is disclosed in Japanese unexamined patent publication No. H8-64634. The MOSFET comprises a semiconductor pellet on which a field effect transistor (MOSFET element) is formed in a compact and plate-like configuration, a plurality of inner leads electrically connected to a surface electrode of the semiconductor pellet for electrically conducting the MOSFET element to the outside, a header for improving radiating performance and resin encapsulant formed by encapsulating the semiconductor pellet, the inner leads and a part of the header with resin. Each of the inner leads is mechanically and electrically connected through protruding terminals to a principal surface of the semiconductor pellet which is a circuit forming surface, and the header is bonded to a back surface of the semiconductor pellet which is the surface opposite to the principal surface.

In this MOSFET, since each of the inner leads is electrically connected to the surface electrode of the semiconductor pellet through the protruding terminals, external resistance is lower than that in the case of electrical connection using bonding wires. Further, since the header is separate from the inner leads, the header can be formed using a material having preferable radiating performance irrespective of the material of the inner leads, which makes it possible to improve the radiating performance of the header.

In the above-described MOSFET, the sum of electrical resistance of bonding wires, electrical resistance of aluminum wiring on the semiconductor pellet (hereinafter referred to as "external resistance") and resistance inside the semiconductor pellet (hereinafter referred to as "internal resistance") is the on resistance of the MOSFET as a whole. Substantially no problem is caused by the external resistance when the internal resistance is high.

However, when the magnitude of the external resistance exceeds about 50% of the entire resistance as a result of technical advances toward improvements to reduce the internal resistance, situations occur wherein the external resistance is not negligible.

In the above-described MOSFET, since each of the inner leads is electrically connected to the surface electrode of the semiconductor pellet through the protruding terminals, the external resistance can be lower than that in the case of electrical connection using bonding wires. However, since an outer lead connected to each of the inner leads becomes long accordingly, there is a corresponding reduction of the effect of reducing the external resistance.

It is an object of the invention to provide a semiconductor device in which the external resistance can be significantly reduced and a method of manufacturing the same.

It is another object of the invention to provide a semiconductor device whose thermal resistance and packaging height can be reduced and a method of manufacturing the same.

The above and other objects and novel features of the invention will become apparent from the description of the present specification and the accompanying drawings.

SUMMARY OF THE INVENTION

According to the present invention, there is provided a semiconductor device comprising:

a semiconductor pellet having a field effect transistor fabricated on a principal surface thereof and formed in a compact and plate-like configuration;

a plurality of inner leads for electrically conducting the field effect transistor element to the outside;

outer leads connected to the respective inner leads;

a header for improving radiating performance; and a resin encapsulant for resin-encapsulating the inner leads and a part of the header, wherein each of the inner leads is mechanically and electrically connected to the principal surface of the semiconductor pellet with a connecting portion constituted by a protruding terminal;

the header exposed from the resin encapsulant is mechanically and electrically connected to a surface of the semiconductor pellet opposite to the principal surface; and each of the outer leads is bent in a gull wing configuration.

As a result, since an inner lead coupling portion for supporting each of the inner leads is directly connected to the semiconductor pellet by the respective connecting portion, external resistance can be lower than that in the case of electrical connection using bonding wires.

Since the outer leads formed in a gull wing configuration and the header mechanically and electrically connected to the semiconductor pellet can be surface-mounted on a printed circuit board, a further reduction of external resistance can be achieved.

Since the header is separate from the inner leads, the radiating performance of the header can be improved by forming it using a material having preferable radiating performance irrespectively of the material of the inner leads. Further, since the header is surface-mounted on a printed circuit board, heat from the semiconductor pellet can be effectively released to the printed circuit board as a result of thermal conduction, which makes it possible to improve the radiating performance further.

According to the invention, there is provided a semiconductor device comprising:

a plurality of inner leads electrically connected to a surface electrode of a semiconductor pellet having a field effect transistor on a principal surface thereof;

a connecting portion for electrically connecting the surface electrode of the semiconductor pellet and the inner leads;

a resin encapsulant formed by encapsulating the semiconductor pellet and the inner leads with resin;

a plurality of outer leads connected to the inner leads and protruding in parallel from the same lateral surface of the resin encapsulant; and a header bonded to a surface of the semiconductor pellet opposite to the principal surface and having a header protruding portion protruding from a lateral surface of the resin encapsulant opposite to the lateral surface from which the outer leads protrude, wherein a surface of the header opposite to the surface thereof bonded to the semiconductor pellet is exposed from the resin encapsulant; and the outer leads are bent.

Since the header is provided with the header protruding portion, the area of the header can be significantly increased to release a significant part of heat generated at the semiconductor pellet through the header having the header protruding portion.

This makes it possible to reduce the thermal resistance of the semiconductor device further.

According to the invention, there is further provided a semiconductor device comprising:

a plurality of inner leads electrically connected to a surface electrode of a semiconductor pellet having a field effect transistor on a principal surface thereof;

a connecting portion for electrically connecting the surface electrode of the semiconductor pellet and the inner leads;

a resin encapsulant formed by encapsulating the semiconductor pellet and the inner leads with resin, a plurality of outer leads connected to the inner leads and protruding in parallel from the same lateral surface of the resin encapsulant; and a header bonded to a surface of the semiconductor pellet opposite to the principal surface and having a header protruding portion protruding from a lateral surface of the resin encapsulant opposite to the lateral surface from which the outer leads protrude, wherein a surface of the header opposite to the surface thereof bonded to the semiconductor pellet is an exposed surface exposed from the resin encapsulant;

the outer leads are bent; and the exposed surface of the header and a mounted surface of the outer leads are provided at substantially the same height.

According to the invention, there is provided a method of manufacturing a semiconductor device comprising the steps of:

providing a semiconductor pellet having a field effect transistor fabricated on a principal surface thereof and formed in a compact plate-like configuration;

providing a lead frame to which a plurality of inner leads and outer leads connected to the respective inner leads are coupled;

providing a header formed in a plate-like configuration using a material having preferable electrical and thermal conductivity;

mechanically and electrically connecting each of the inner leads to the semiconductor pellet with a connecting portion constituted by a protruding terminal at the inner lead or the semiconductor pellet;

mechanically and electrically connecting a surface of the semiconductor pellet opposite to the principal surface to the header;

forming a resin encapsulant by encapsulating the semiconductor pellet, the inner leads and a part of the header with resin; and bending the plurality of outer leads in a gull wing configuration.

According to the invention, there is provided a method of manufacturing a semiconductor device comprising the steps of:

providing a semiconductor pellet having a field effect transistor fabricated on a principal surface thereof;

providing a lead frame to which a plurality of inner leads and a plurality of outer leads electrically connected to the respective inner leads are coupled;

providing a header formed in a plate-like configuration;

electrically connecting the inner leads and a surface electrode of the semiconductor pellet with a connecting portion constituted by a protruding terminal at the inner lead or the semiconductor pellet;

bonding the header and a surface of the semiconductor pellet opposite to the principal surface;

encapsulating the semiconductor pellet, the inner leads and a part of the header with resin to form a resin encapsulant from which a surface of the header opposite to the surface thereof bonded to the semiconductor pellet is exposed and from which a header protruding portion protrudes in the direction opposite to the protruding direction of the outer leads; and bending the plurality of outer leads.

BRIEF DESCRIPTION OF THE DRAWINGS

FIGS. 6(a) and 6(b) illustrate an example of a resin encapsulation step according to the first embodiment, FIG. 6(a) being a partial omitted frontal sectional view of the same, FIG. 6(b) being a sectional view taken along the line B-B in FIG. 6A;

FIG. 24(b) being a partial enlarged sectional view taken along the line N-N in FIG. 24(a);

DESCRIPTION OF THE PREFERRED EMBODIMENTS

The following description of preferred embodiments will not refer to identical or similar parts repeatedly unless necessity arises.

While a preferred embodiment will be described as a plurality of sections or a plurality of embodiments where it is necessary for convenience, they are related to each other instead of being independent, e.g., one embodiment may be a partial or overall modification of another embodiment or may be detailed or supplementary description of another embodiment unless otherwise specified.

When the number of elements and the like (number of elements, numerical values, quantities, ranges and the like) are mentioned in the context of the following embodiment, the particularly mentioned quantities will not limit the invention, and quantities above or below the particular quantities may be used instead unless otherwise specified or unless the particular quantities are limiting in view of the principle of the invention.

A preferred embodiment of the invention will now be described with reference to the drawings. Throughout the drawings for explaining the embodiment, members having the same functions are indicated by the same reference numbers and will not be described repeatedly.

A first embodiment of the invention will now be described with reference to an illustration of a structure of a MOSFET in FIGS. 1A, 1B and 1C and illustrations of a method of manufacturing the MOSFET shown in FIGS. 2A though 8B.

A semiconductor device according to the first embodiment is a field effect transistor referred to as "MOSFET (metal oxide semiconductor field effect transistor)", and a MOSFET 1 is a power MOS transistor that generates high output and high heat.

Figure 1A:
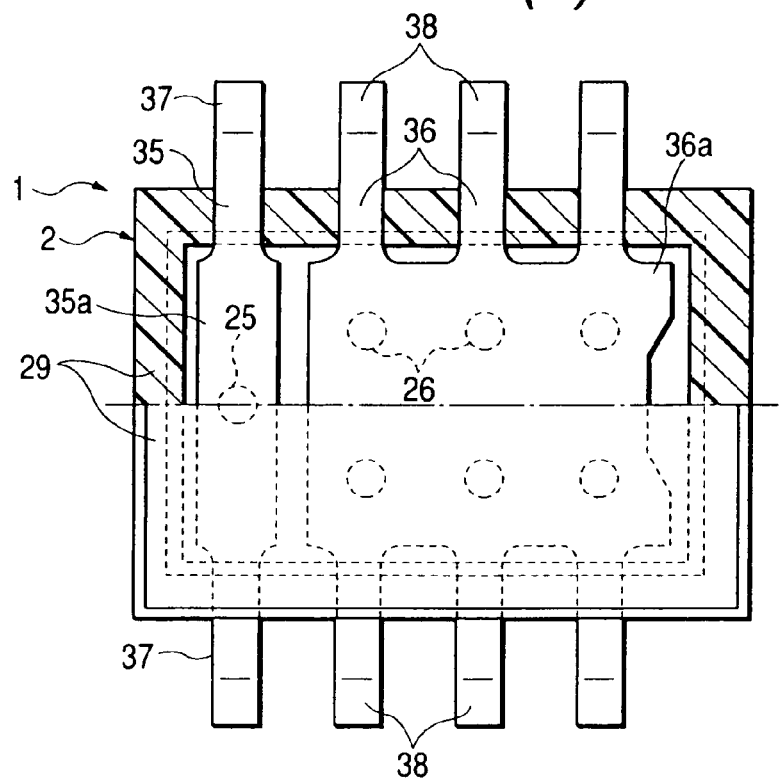
FIGS. 1(a) through 1(c) illustrate an example of a structure of a MOSFET which is a semiconductor device according to a first embodiment of the invention, FIG. 1(a) being a partially cutaway plan view of the same, FIG. 1(b) being a partially cutaway front view of the same, FIG. 1(c) being a partially cutaway side view.
Figure 1B:
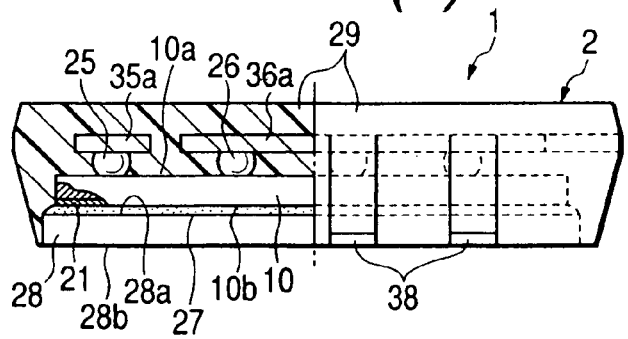
Figure 1C:
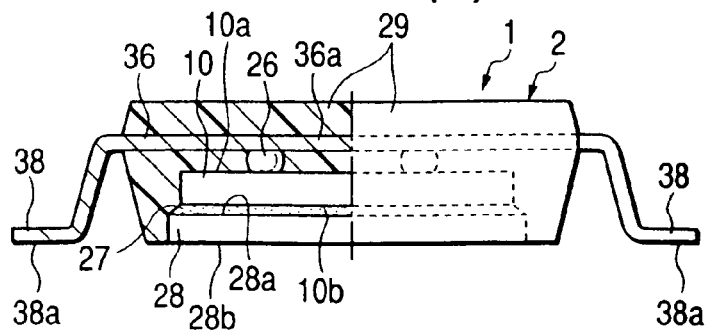

Referring to a schematic configuration of the MOSFET 1 shown in FIGS. 1(a) through 1(c), it comprises a semiconductor pellet 10 having a field effect transistor fabricated on a principal surface 10a thereof and formed in a compact plate-like configuration, a plurality of inner leads 35 and 36 for electrically conducting the field effect transistor element to the outside, a gate connecting piece 35a (inner lead coupling portion) for supporting two inner leads 35, a gate connecting portion (connecting portion) 25 constituted by a protruding terminal (bump) for electrically connecting the gate connecting piece 35a and the semiconductor pellet 10, a source connecting piece 36a (inner lead coupling portion) for supporting six inner leads 36, source connecting portions (connecting portions) 26 constituted by protruding terminals (bumps) for electrically connecting the source connecting pieces 36a and the semiconductor pellet 10, outer leads 37 and 38 connected to the inner leads 35 and 36 respectively, a header 28 for improving radiating performance and a resin encapsulant 29 which encapsulates the inner leads and a part of the header 28 with resin.

In the MOSFET 1 of the present embodiment, therefore, the inner leads 35 and 36 are mechanically and electrically connected to the principal surface 10a of the semiconductor pellet 10 by the gate connecting portion 25 and source connecting portions 26 constituted by bumps through the respective gate connecting piece 35a and source connecting pieces 36a.

The header 28 exposed from the resin encapsulant 29 is mechanically and electrically connected to a surface of the semiconductor pellet 10 opposite to the principal surface 10a (hereinafter, this surface is referred to as "back surface" 10b), and each of the outer leads 37 and 38 is bent in a gull wing configuration.

Inside the resin encapsulant 29, mechanical and electrical connection is established between a gate electrode pad 19 which is a surface electrode of the semiconductor pellet 10 and the gate inner lead 35 through the gate connecting portion 25, between a source electrode pad 20 which is a surface electrode of the semiconductor pellet 10 and the source inner leads 36 through the source connecting portions 26 and between a drain electrode pad 21 formed on the back surface 10b (bottom surface) of the semiconductor pellet 10 and the header 28 through a drain connecting portion 27.

A bottom surface of the header 28 or a surface thereof opposite to a surface 28a bonded to the semiconductor pellet 10 is an exposed surface 28b which is exposed from the resin encapsulant 29 on the bottom surface thereof.

The MOSFET according to the first embodiment of the invention is manufactured using a manufacturing method as described below.

A method of manufacturing the MOSFET which is a semiconductor device according to the present embodiment will now be described. The description will clarify the details of the configuration of the MOSFET.

Figure 2A:
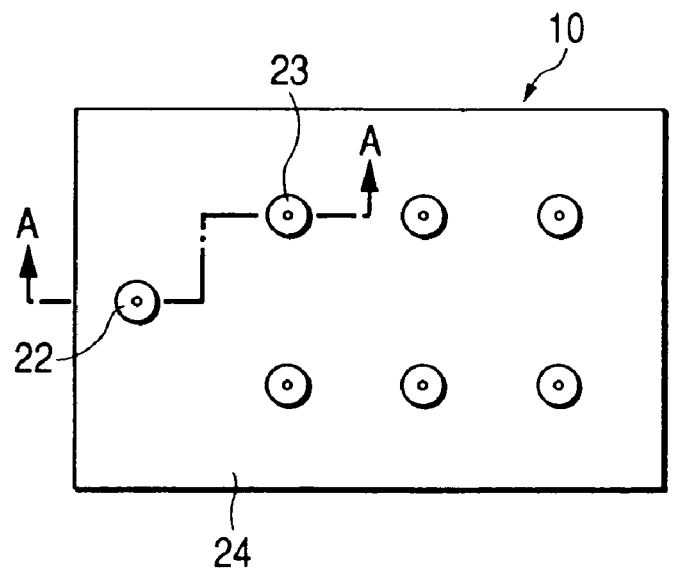
FIGS. 2(a) and 2(b) illustrate an example of a structure of a semiconductor pellet used in a method of manufacturing the MOSFET shown in FIGS. 1(a) through 1(c), FIG. 2(a) being a plan view of the same, FIG. 2(b) being an enlarged sectional view taken along the line A-A in FIG. 2(a)
Figure 2B:
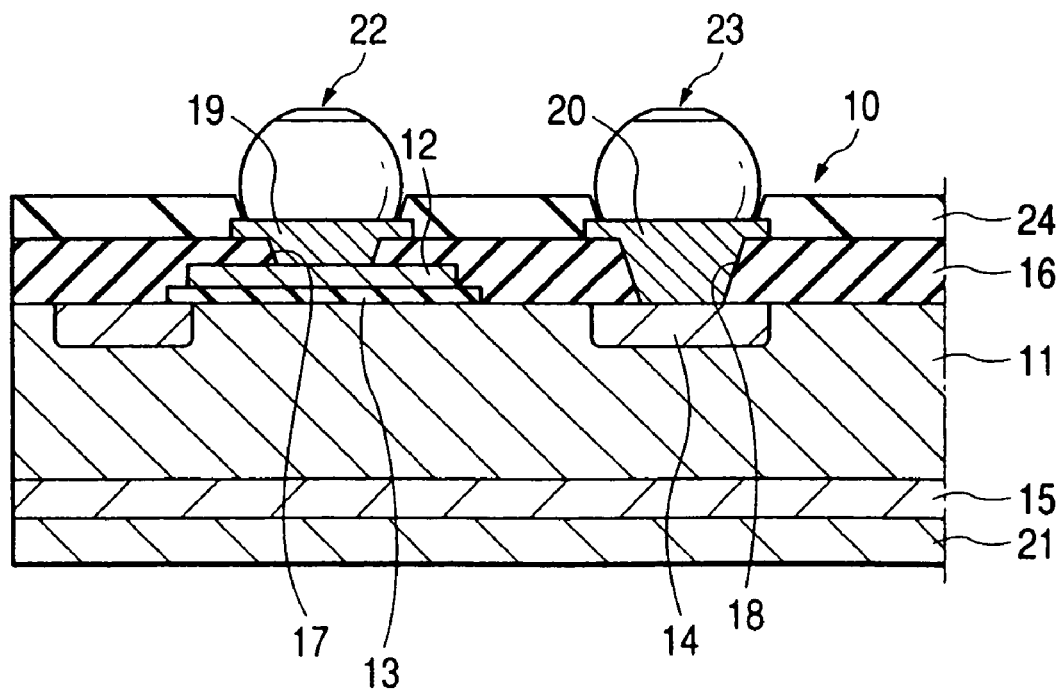
Figure 3A:
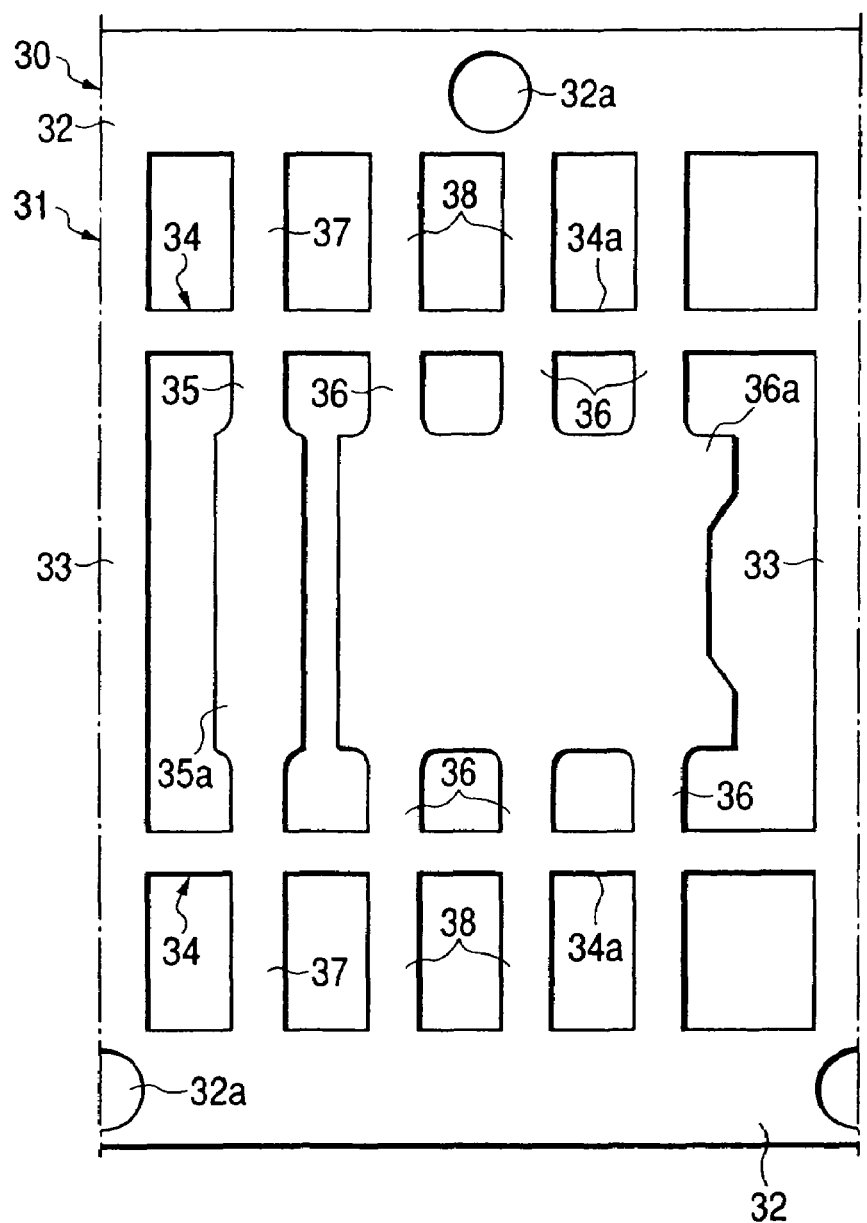
FIGS. 3(a) and 3(b) illustrate an example of a structure of a multiple lead frame, FIG. 3(a) being a partial omitted plan view of the same, FIG. 3(b) being a sectional view of the same.
Figure 3B:
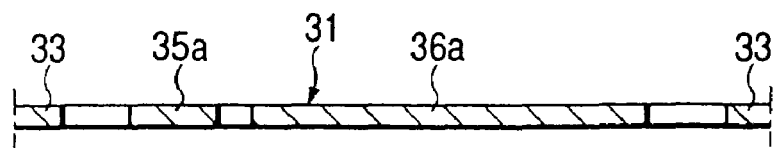
Figure 5A:
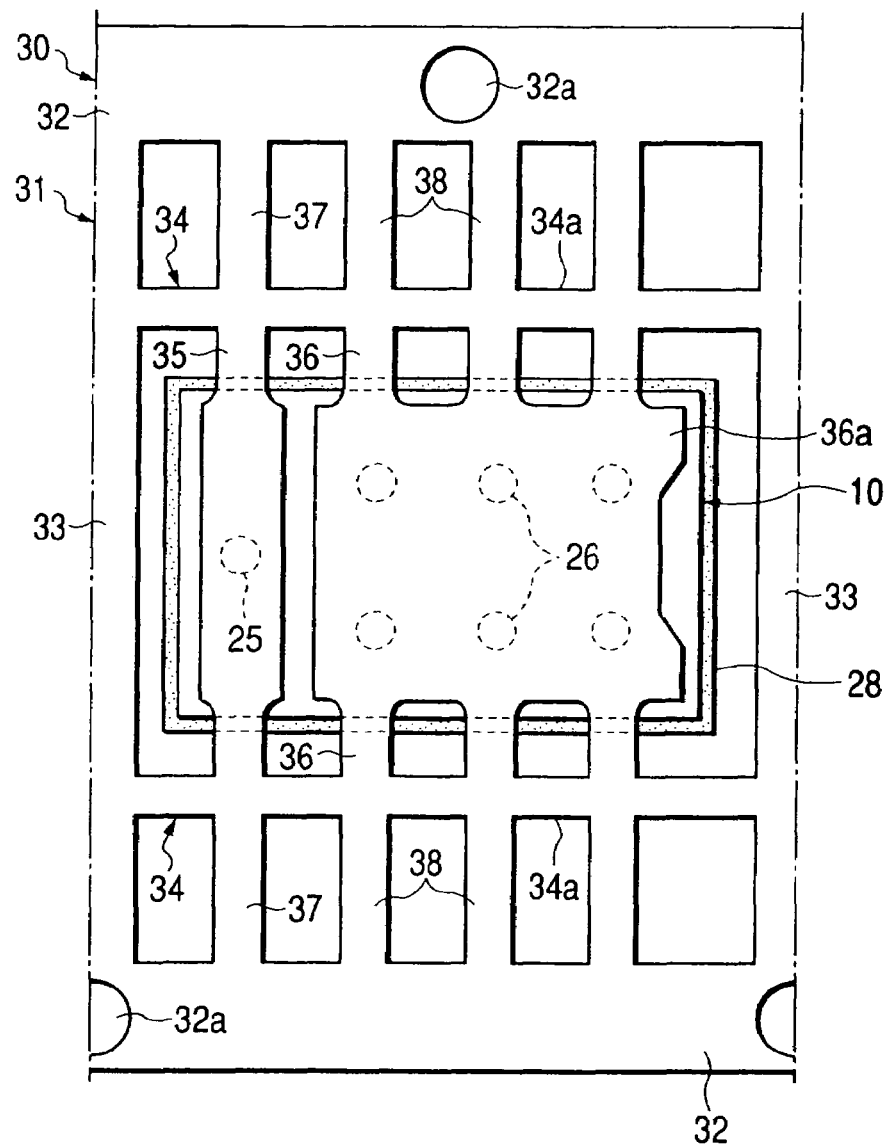
FIGS. 5(a) and 5(b) illustrate an example of the structure of the first embodiment at a stage after the bonding of a pellet, FIG. 5(a) being a partial omitted plan view of the same, FIG. 5(b) being a frontal sectional view of the same.
Figure 5B:
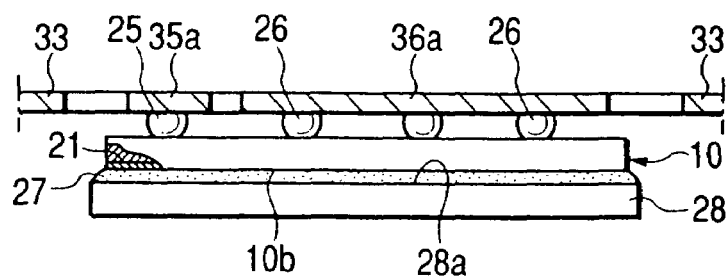

According to the method of manufacturing the MOSFET 1, a semiconductor pellet 10 as shown in FIGS. 2(a) and 2(b), a multiple lead frame 30 as shown in FIGS. 3(a) and 3(b) and a header 28 as shown in FIGS. 5(a) and 5(b) are prepared at a pellet preparation step, a lead frame preparation step and a header preparation step, respectively.

The semiconductor pellet 10 shown in FIGS. 2(a) and 2(b) is manufactured by appropriately fabricating field effect transistors on a wafer at a so-called pre-process for steps of manufacturing the MOSFET 1 and by thereafter cutting (dicing) the wafer into small square thin plates.

The semiconductor pellet 10 has a substrate 11 on which a gate 12 is formed from polysilicon with underlying silicon oxide film 13 interposed therebetween. A source 14 as a semiconductor diffusion layer is formed in the substrate 11 in a region of the substrate 11 outside the gate 12, and a drain 15 is formed under the substrate 11.

An insulation film 16 constituted by a CVD oxide film or the like is formed on the substrate 11 to cover the gate 12 and source 14, and the insulation film 16 is formed with one gate contact hole 17 in a position in a face-to-face relationship with the gate 12 such that it penetrates to the gate 12. A plurality of source contact holes 18 are provided on the insulation film 16 in regions in a face-to-face relationship with the source 14 such that each of them penetrates to the source 14 on one side of the gate contact hole 17.

Further, a gate electrode pad 19 is formed in the gate contact hole 17, and a source electrode pad 20 is formed in each of the source contact holes 18. The electrode pads 19 and 20 are formed by depositing an aluminum type material (aluminum or an alloy of the same) on the insulation film 16 by means of sputtering deposition or the like and by thereafter patterning the material using a photo-etching process.

Specifically, since the aluminum type material deposited on the insulation film 16 fills each of the contact holes 17 and 18, the electrode pads 19 and 20 constituted by the filled regions are electrically connected to the gate 12 and source 14, respectively. The drain electrode pad 21 is formed on the bottom surface of the substrate 11 by depositing an aluminum type material thereon.

A protective film 24 made of an insulating material such as phosphorus silicate glass or polyimide type resin is deposited on the gate electrode pad 19 and the plurality of source electrode pads 20, and a gate bump 22 and source bumps 23 protrude from the protective film 24 in positions where they are in a face-to-face relationship with the gate electrode pad 19 and source electrode pads 20, respectively.

The bumps 22 and 23 are formed using gold (Au) wise according to the stud bump bonding (SBB) method. Specifically, they are bumps formed by bonding balls on the ends of wires on to the pads (first bonding) using a nail head (thermo-compression bonding) type wire bonding apparatus or nail head ultrasonic (thermo-compression bonding) type wire bonding apparatus and by thereafter pulling the wires to cut them at the regions where they are connected to the balls.

The multiple lead frame 30 shown in FIGS. 3(a) and 3(b) is integrally formed by using means such as a punching press process or etching process on a thin plate made of a material having preferable conductivity such as an iron-nickel alloy or phosphor bronze or a copper alloy which is the same material as for the header 28. The multiple lead frame 30 is a plurality of unit lead frames 31 which are provided in parallel in a row in one direction. FIGS. 3(a) and 3(b) show only a part for one MOSFET (one unit).

A unit lead frame 31 has a pair of outer frames 32 having a positioning hole 32a, and the outer frames 32 on both ends are provided in parallel with each other at a predetermined interval and are provided to extend in series. A pair of section frames 33 are provided between adjoining unit lead frames 31 such that they are integrally stretched in parallel with each other between the outer frames 32 at both ends. A unit lead frame 31 is defined in a substantially rectangular frame formed by such outer frames and section frames.

In a unit lead frame 31, a pair of dam members 34 are integrally stretched between the section frames 33 on both sides thereof perpendicularly to the section frames 33 at an interval from each other. A pair of gate inner leads 35 are provided at one end of the pair of dam members 34 such that they integrally protrude from the inner edges of the dam members 34 perpendicularly thereto, and a rectangular plate-like gate connecting piece 35a is integrally formed between both of the gate inner leads 35.

A plurality of source inner leads 36 are distributed over the remaining part of each of the inner edges of the opposite dam members 34 (three leads on one side or total six leads in FIG. 3(a)) such that they protrude at an equal pitch in the longitudinal direction. A rectangular plate-like source connecting piece 36a is integrally formed between the opposite source inner leads 36. Although not shown, a plating process is performed using tin (Sn) or gold (Au) on one principal surface of the gate connecting piece 35a and source connecting piece 36a to allow bumps 22 and 23 protruding on the semiconductor pellet 10 to provide an adequate mechanical and electrical connecting function.

A pair of gate outer leads 37 protrude from respective outer edges of the opposite dam members 34 in positions opposite to the gate inner leads 35 such that they serve as extensions of the respective gate inner leads 35.

Source outer leads 38 protrude from respective outer edges of the opposite dam members 34 in positions opposite to the respective source inner leads 36 such that they serve as extensions of the respective source inner leads 36. Dams 34a are formed between the adjoining outer leads and between the outer leads and the section frames 33 on both sides to stop the flow of resin (molding resin) 60 as shown in FIGS. 6(a) and 6(b) during the molding of a resin encapsulant 29 to be described later.

Figure 4A:
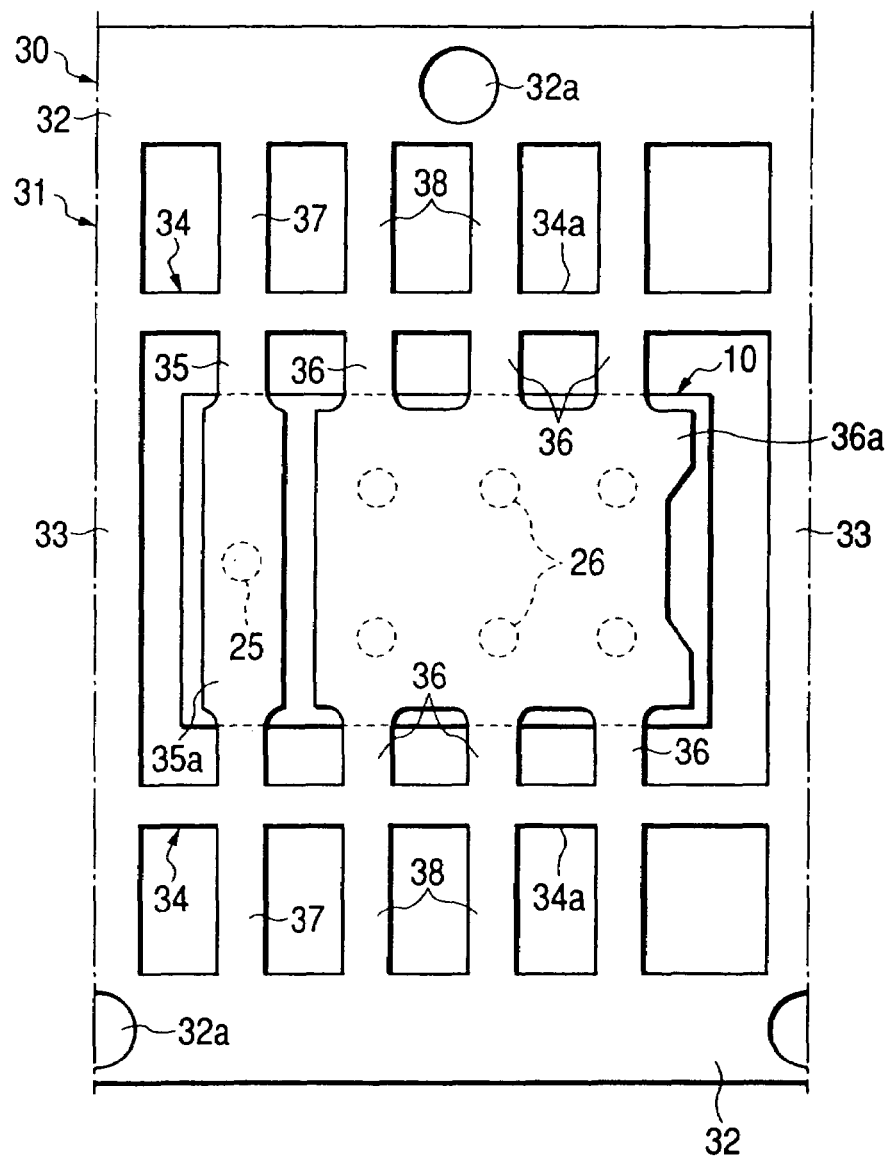
FIGS. 4(a) and 4(b) illustrate an example of the structure of the first embodiment at a stage after the bonding of inner leads, FIG. 4(a) being a partial omitted plan view of the same, FIG. 4(b) being a frontal sectional view of the same.
Figure 4B:
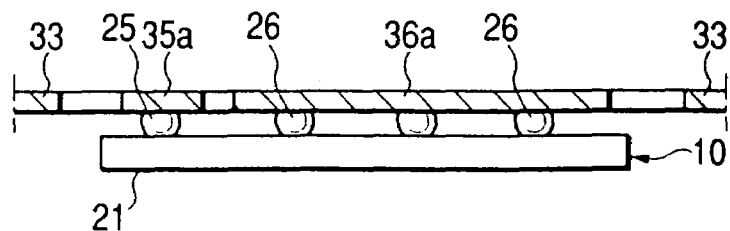

A semiconductor pellet 10 is bonded to a lead frame having a configuration as described above as shown in FIGS. 4(a) and 4(b) at an inner lead bonding step. At this time, the multiple lead frame 30 is stepwise forwarded in one direction by a bonding apparatus (not shown).

At an inner lead bonding stage disposed in the middle of the multiple lead frame 30 which is being forwarded stepwise, the semiconductor pellets 10 face the unit lead frames 31 located under the same and are assembled on to the multiple lead frame 30 by bonding the bumps 22 and 23 to the connecting pieces 35a and 36a of the inner leads 35 and 36 in alignment therewith on a thermo-compression basis with a bonding tool.

Specifically, the bumps 22 and 23 are urged into contact with the connecting pieces 35a and 36a while being heated and are thereby connected to the connecting pieces 35a and 36a on a thermo-compression basis. A gate connecting portion 25 and source connecting portions 26 are respectively formed between the gate electrode pad 19 on the semiconductor pellet 10 and the gate connecting piece 35a of the gate inner lead 35 and between the source electrode pads 20 and the source connecting pieces 36a of the source inner leads 36.

Therefore, the gate electrode pad 19 and the gate inner leads 35 are mechanically and electrically connected by the gate connecting portion 25, and the source electrode pads 20 and the source inner leads 36 are mechanically and electrically connected by the source connecting portions 26, and such mechanical connection puts the semiconductor pellet 10 in a state wherein it is mechanically connected to or securely assembled on to the unit lead frame 31.

Headers 28 formed in a rectangular plate-like configuration slightly larger than a semiconductor pellet 10 as shown in FIG. 5(a) are mechanically and electrically connected to the back surfaces 10b of semiconductor pellets 10 bonded to a multiple lead frame 30 with inner leads as described above using a material having preferable electrical and thermal conductivity such as a copper type material (copper or a copper alloy).

Specifically, the top surface of a header 28 (surface 28a to be bonded to a semiconductor pellet) is applied with a bonding material having preferable electrical and thermal conductivity such as Ag paste and is thereafter put into contact with and bonded to the back surface 10b (bottom surface) of a semiconductor pellet 10. As a result, the layer of the bonding material forms the drain connecting portion 27 that mechanically and electrically connects the drain electrode pad 21 of the semiconductor pellet 10 and the header 28.

Resin encapsulants 29 made of insulating resin such as epoxy resin are simultaneously formed on an assembly of semiconductor pellets 10 with headers and a multiple lead frame 30 formed as described above at a resin encapsulant molding step in association with respective unit lead frames 31 using a transfer molding apparatus 50 as shown in FIG. 6(a).

The transfer molding apparatus 50 shown in FIG. 6(a) has a pair of dies, i.e., an upper die 50 and a lower die 51 which are clamped by a cylinder device or the like (not shown), and a plurality of sets of upper die cavities 53a and lower die cavities 53b (only one set is shown) are formed on mating surfaces 61 of the upper die 51 and lower die 52 such that the upper die cavities 53a and lower die cavities 53b cooperate to form cavities 53.

A pot 54 is provided on the mating surface 61 of the upper die 51, and a plunger 55 moved back and forth by a cylinder device (not shown) is inserted in the pot 54 to supply molding resin 60 as a molding material. A cull 56 is formed in a position on the mating surface 61 of the lower die 52 where it faces the pot 54. One end of a gate 57 for injecting the resin 60 into the cavity 53 is connected to the cull 56, and another end of the gate 57 is connected to the lower die cavities 53b.

A through gate 58 is connected to the side of a lower die cavity 53b opposite to the gate 57 therefor, and the through gate 58 is connected to the side of an adjacent lower die cavity 53b that faces the first cavity. The through gate 58 is configured to allow the resin 60 filled in a cavity 53 upstream thereof to flow therethrough to fill cavity 53 downstream thereof.

In order to clear the thickness of the unit lead frames 31, a clearance recess 59 is formed on the mating surface 61 of the lower die 52 to a predetermined depth in a rectangular configuration slightly larger than the outline of the multiple lead frame 30 and substantially equal thereto in thickness.

When the resin encapsulant 29 is molded using the transfer molding apparatus 50 having such a configuration, an assembly having the above-described configuration is set in the clearance recess 59 formed on the lower die 52, and the semiconductor pellets 10 are set in the lower die cavities 53b.

When the upper die 51 and lower die 52 are subsequently clamped, since the section frames 33 on both sides of a unit lead frame 31 and the dam members 34 on both ends thereof are strongly urged by the mating surfaces 61 of the upper die 51 and lower die 52, the bottom surface (exposed surface 28b) of the header 28 is put in tight contact with the bottom of the lower die cavity 53b as shown in FIGS. 6(a) and 6(b).

That is, since the unit lead frame 31 is held along the entire circumference thereof because of the press upon the section frames 33 on both sides and the dam members 34 on both ends, an elastic force of the inner leads 35 and 36 keeps the bottom surface of the header 28 urged against the bottom of the lower die cavity recess 53b strongly.

Thereafter, the plunger 55 supplies the resin 60 from the pot 54 through the gate 57 and through gates 58 to fill the cavities 53 sequentially. Since the bottom surfaces of the headers 28 are in tight contact with the bottoms of the lower die cavity recesses 53b, the leakage of the resin 60 to the bottom surfaces of the headers 28 is prevented, which makes it possible to prevent occurrence of a thin resin flash around the periphery of the bottom surfaces of the headers 28.

The injected resin 60 is thermally set to mold the resin encapsulants 29, and the upper die 51 and lower die 52 are opened. The resin encapsulants 29 are released from the dies by ejector pins (not shown).

Figure 7A:
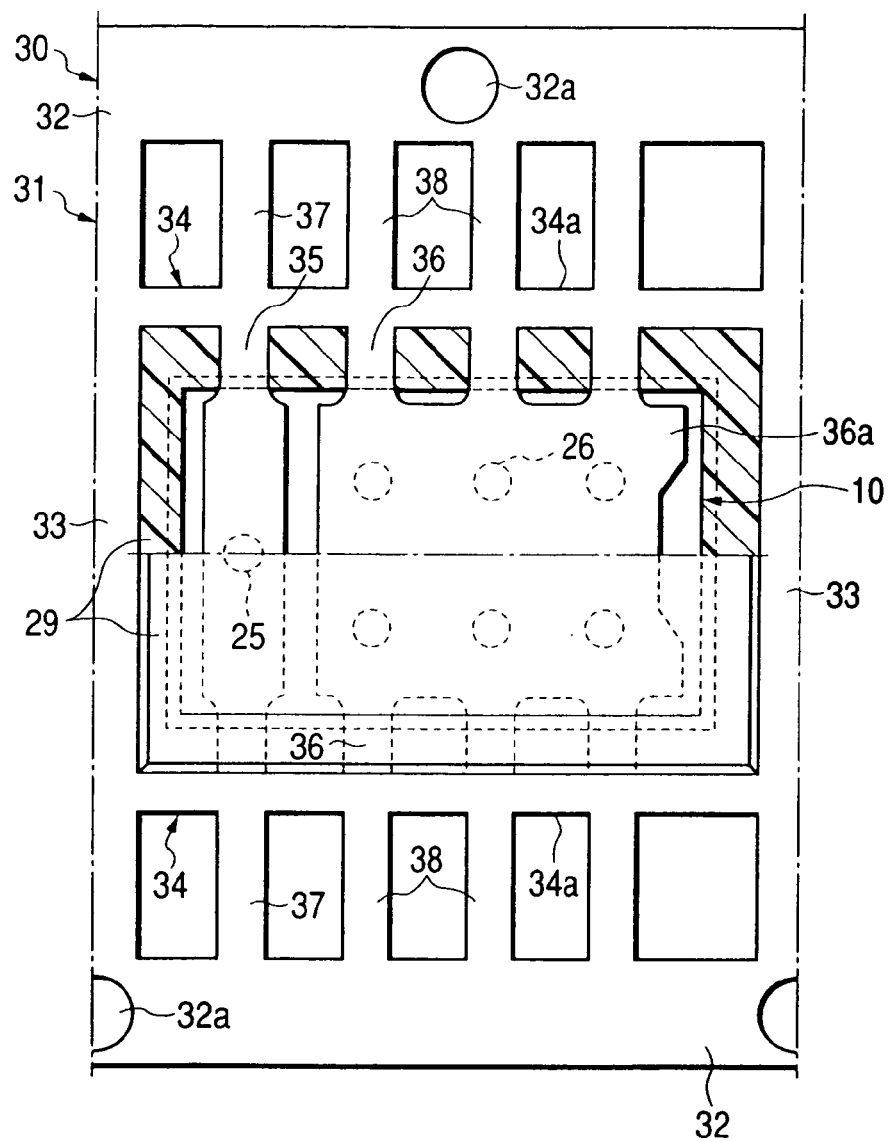
FIGS. 7(a) and 7(b) illustrate an example of the structure of the first embodiment at a stage after the molding of a resin encapsulant, FIG. 7(a) being a partial omitted plan view of the same, FIG. 7(b) being a frontal sectional view of the same.
Figure 7B:
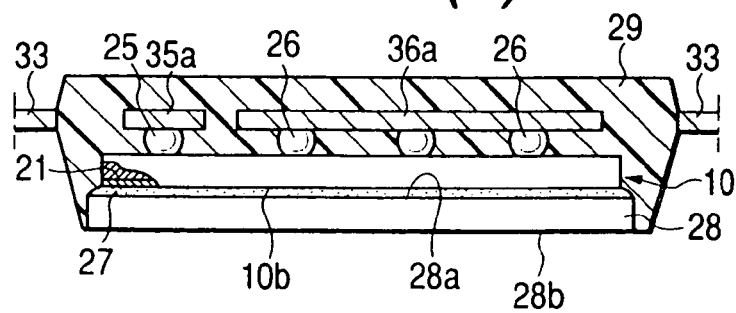

FIGS. 7(a) and 7(b) show an assembly of a multiple lead frame 30 and a resin encapsulant 29 obtained after the molding of resin encapsulants. The resin encapsulant 29 of this assembly encapsulates therein a semiconductor pellet 10, inner leads 35 and 36 and a part (lateral surfaces) of the header 28 coupled to the back surface 10b of the semiconductor pallet 10 with resin. In this state, the surface of the header 28 coupled to the back surface 10b of the semiconductor pellet 10 opposite to the surface 28a thereof bonded to the pellet is exposed from the resin encapsulant 29.

Specifically, the header 28 is formed with an exposed surface 28b which is exposed from the resin encapsulant 29 on the side thereof opposite to the surface 28a bonded to the pellet. The outer leads 37 and 38 protrude from the lateral surfaces on both longer sides of the resin encapsulant 29 perpendicularly thereto.

The assembly having such a resin encapsulant 29 molded thereon is subjected to a solder plating process and then a lead frame cutting and shaping step where the outer frames 32, section frames 33 and dams 34a are cut off and the outer leads 37 and 38 are bent into a gull wing configuration. The MOSFET 1 shown in FIGS. 1(a) through 1(c) is thus manufactured.

That is, the package 2 of the MOSFET 1 shown in FIGS. 1(a) through 1(c) has the semiconductor pellet 10 and the resin encapsulant 29 that encapsulates the plurality of inner leads 35 and 36 and a part of the header 28 with resin and the plurality of outer leads 37 and 38, and the resin encapsulant 29 is formed in a rectangular plate-like configuration. The outer leads 37 and 38 are arranged at equal intervals on the two lateral surfaces on the longer sides of the resin encapsulant 29 and are bent in a gull wing configuration.

Inside the resin encapsulant 29, mechanical and electrical connection is established between the gate electrode pad 19 of the semiconductor pellet 10 and the gate inner lead 35 through the gate connecting portion 25, between the source electrode pad 20 of the semiconductor pellet 10 and the source inner leads 36 through the source connecting portions 26 and between the drain electrode pad 21 formed on the back surface 10b of the semiconductor pellet 10 and the header 28 through the drain connecting portion 27.

The bottom surface of the header 28 is exposed on the bottom surface of the resin encapsulant 29 to serve as an exposed surface 28b, and there is no resin flash around the periphery of the exposed surface 28b of the header 28.

Figure 8A:
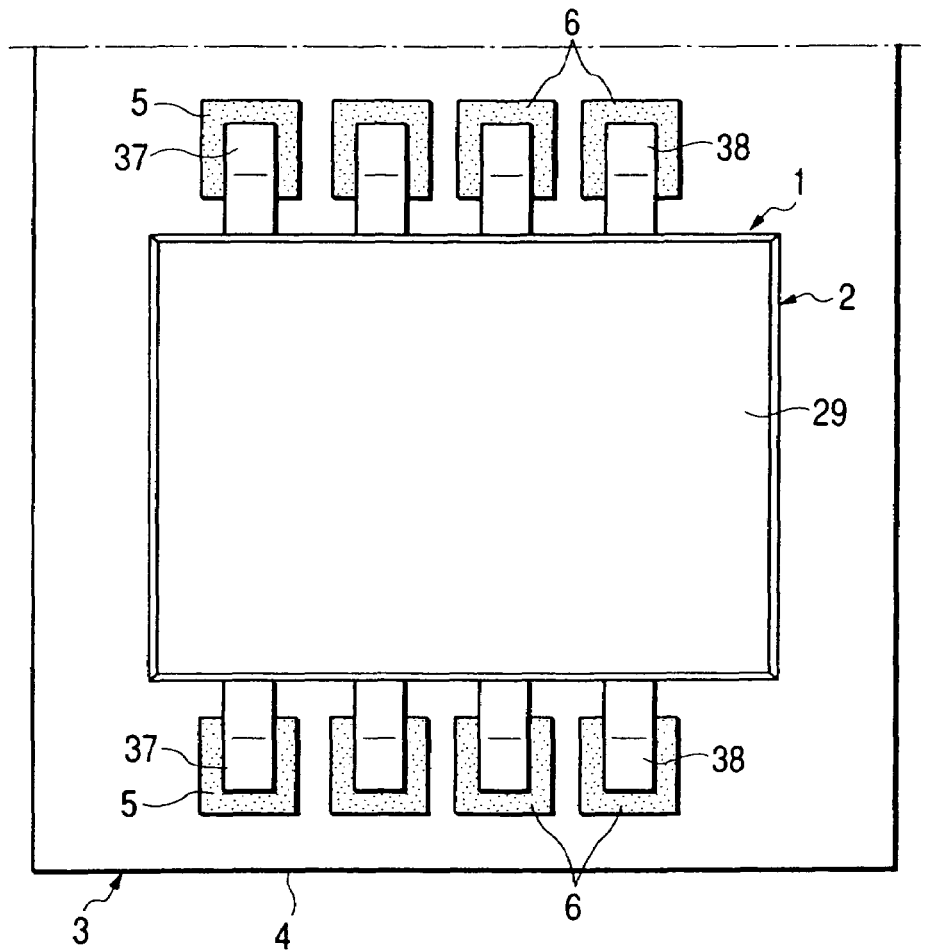
FIGS. 8(a) and 8(b) illustrate an example the packaging of the MOSFET shown in FIGS. 1(a) through 8(b) being a partially cutaway front view of the same.
Figure 8B:
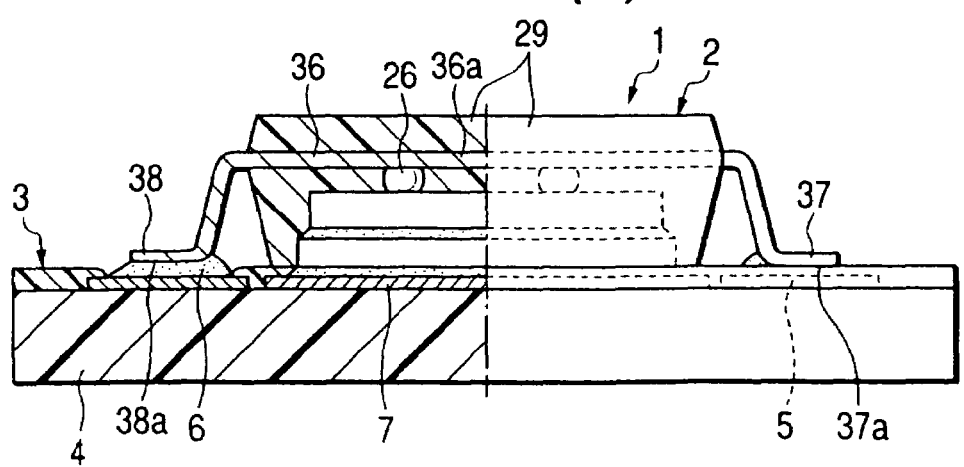

The MOSFET 1 manufactured and configured as described above is surface-mounted on a printed circuit board 3 as shown in FIGS. 8(a) and 8(b). Specifically, alignment and reflow soldering are performed to attach the gate outer leads 37 of the MOSFET 1 to gate lands 5 formed on a main body 4 of the printed circuit board 3, the source outer leads 38 to source lands 6 and the header 28 connected to the drain electrode pad 21 to a drain land 7.

Since the MOSFET 1 is surface-mounted to the printed circuit board 3 as described above, external resistance is significantly reduced. Further, since the header 28 is soldered to the drain land 7 on the printed circuit board 3, not only the external resistance is significantly reduced, but also radiating performance is significantly improved because heat generated at the semiconductor pellet 10 is released to the printed circuit board 3 through thermal conduction.

The semiconductor device and the method of manufacturing the same according to the first embodiment provide the following effects.

Since the inner leads 35 and 36 are mechanically and electrically connected to the semiconductor pellets 10 through the connecting portions 25 and 26, there is no need for electrical connection utilizing bonding wires, which makes it possible to achieve a lower external resistance compared to electrical connection utilizing bonding wires and to improve the performance of the MOSFET 1 consequently.

Since connection with bonding wires is not employed, the package 2 of the MOSFET 1 can be compact and lightweight, which makes it possible to improve the performance of the MOSFET 1 in addition to the effect of reducing external resistance.

Since the header 28 is separate from the inner leads, the radiating performance of the header 28 can be improved by forming the header 28 using a material having preferable radiating performance irrespective of the material of the inner leads 35 and 36.

Since a material optimum for the characteristics of inner leads can be chosen for the inner leads 35 and 36 irrespective of the material of the header 28, the quality and reliability of the MOSFET 1 can be improved further.

Since a plurality of source electrode pads 20 and a plurality of source connecting portions 26 for source inner leads 36 are provided, a high current can flow through the source, which makes it possible to improve the performance of the MOSFET 1 further.

A further reduction of external resistance and further improvement of the radiating performance of the header 28 can be achieved by surface-mounting the outer leads 37 and 38 formed in a gull wing configuration and the header 28 mechanically and electrically connected to the semiconductor pellet 10 on the printed circuit board 3.

Since the outer leads 37 and 38 are distributed over two lateral surfaces of the resin encapsulant 29 opposite to each other, the outer leads 37 and 38 can be molded with resin while being supported on both sides thereof by the mating surfaces 61 of the molding dies (upper die 51 and lower die 52) during the transfer molding of the resin encapsulant 29. Since this allows the header 28 to be put in tight contact with the bottom of the molding die, it is possible to prevent the occurrence of a resin flash around periphery of the exposed surface 28b of the header 28 exposed from the resin encapsulant 29.

Further, the header 28 is formed in a plate-like configuration instead of being bent, and the exposed surface 28b of the header 28 and the mounted surfaces 37a and 38a of the outer leads 37 and 38 are at substantially the same height. Thus, the packaging height of the MOSFET 1 can be small.

It is therefore possible to suppress the packaging height of a MOSFET 1 that generates high output and high heat where there is a limitation on the packaging height.

Figure 27A:
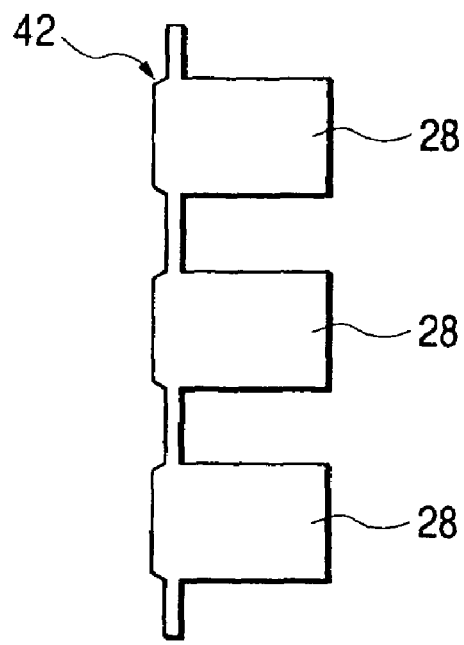
FIGS. 27(a) and 27(b) illustrate a header frame used in a MOSFET as an example comparative to a MOSFET which is a semiconductor device according to the invention and the mounting of a header, FIG. 27(a) being a plan view of the header frame, FIG. 27(b) being a partial sectional view illustrating the mounting of the header using the header frame shown in FIG. 27(a).
Figure 27B:
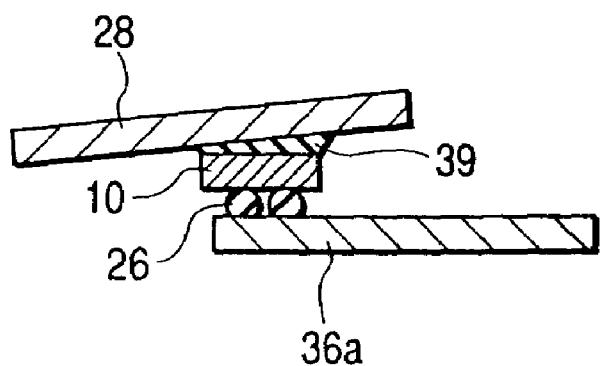

A second embodiment of the invention will now be described with reference to illustrations in FIGS. 9(a) through 12 showing a structure of a MOSFET, illustrations in FIGS. 13 through 22(b) showing a method of manufacturing a MOSFET, illustrations in FIGS. 23(a) through 25 showing effects of a MOSFET and illustrations in FIGS. 27(a) and 27(b) showing a header frame of a MOSFET as a comparative example and the mounting of the header frame.

In the plan views of FIGS. 11(a), 12, 23(a), 23(b) and 24(a), like members are indicated by like hatching.

A MOSFET 70 which is a semiconductor device according to a second embodiment of the invention is a power MOS transistor that generates high output and high heat similar to the MOSFET 1 in the first embodiment.

Figure 9A:
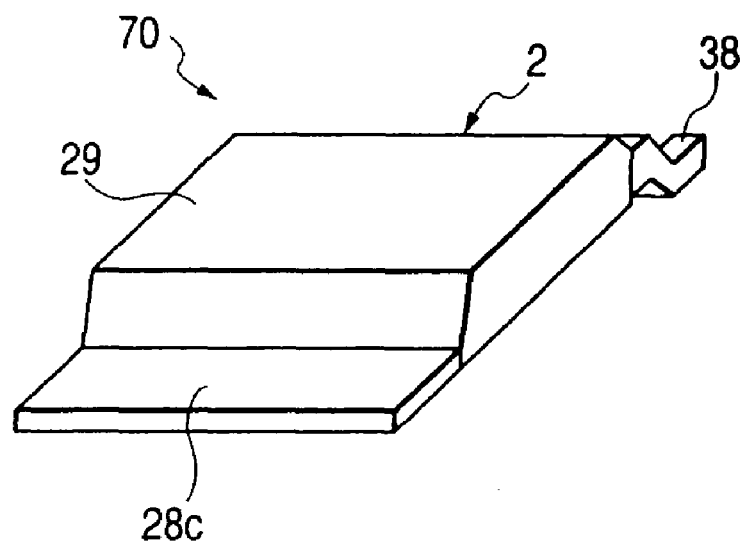
FIGS. 9(a) and 9(b) illustrate an example of a structure of a MOSFET which is a semiconductor device according to a second embodiment of the invention, FIG. 9(a) being an external perspective view as viewed from the side of a header protruding portion, FIG. 9(b) being an external perspective view as viewed from the side of outer leads.
Figure 9B:
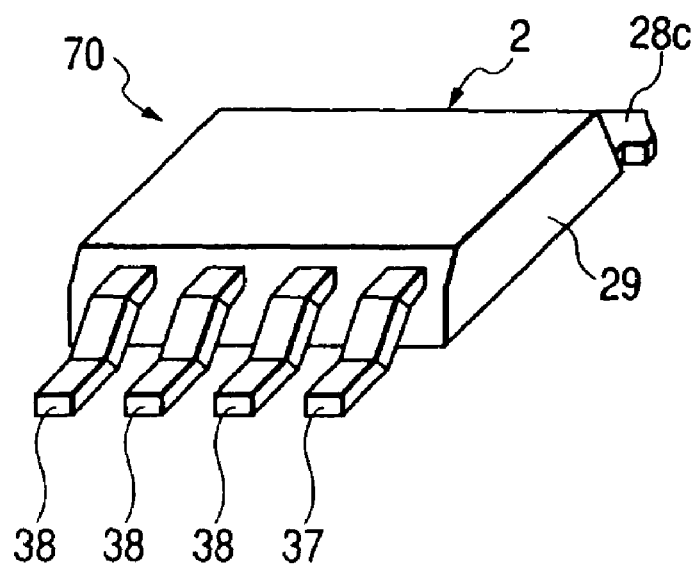

In the MOSFET 70, as shown in FIG. 9(b), three source outer leads 38 and one gate outer lead 37 bent in a gull wing configuration protrude from one of two opposite lateral surfaces of a resin encapsulant 29 and, as shown in FIG.

9(a), a plate-like and substantially quadrangular header protruding portion 28c protrudes from the other of the opposite lateral surfaces.

Figure 10A:
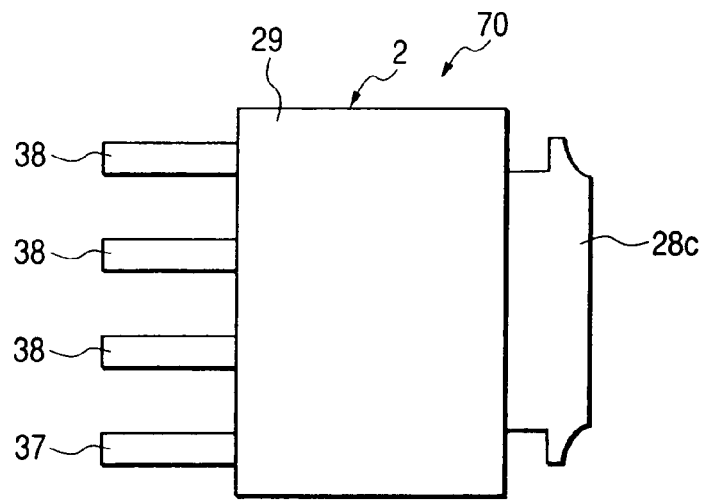
FIGS. 10(a) through 10(c) illustrate the structure of the MOSFET shown in FIGS. 9(a) and 9(b), FIG. 10(a) being a plan view of the same, FIG. 10(b) being a front view of the same, FIG. 10(c) being a bottom view of the same.
Figure 10B:
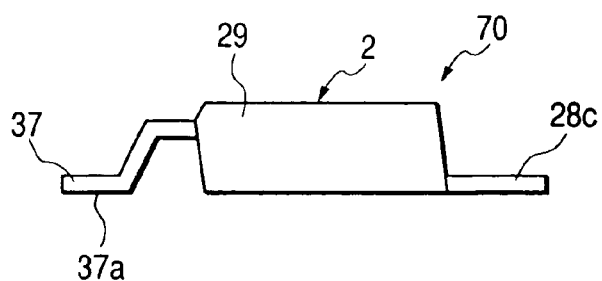

That is, the MOSFET 70 of the present embodiment is different from the MOSFET 1 of the first embodiment in its external structure in that while the MOSFET 1 of the first embodiment has the outer leads 37 and 38 in a gull wing configuration provided on both of opposite lateral surfaces of the resin encapsulant 29, the MOSFET 70 of the present embodiment has no outer leads 37 and 38 in a gull wing configuration on the lateral surface on one side thereof and, instead, it has a plate-like header protruding portion 28c at the lateral surface on that side as shown in FIGS. 10(a) and 10(b).

Figure 10C:
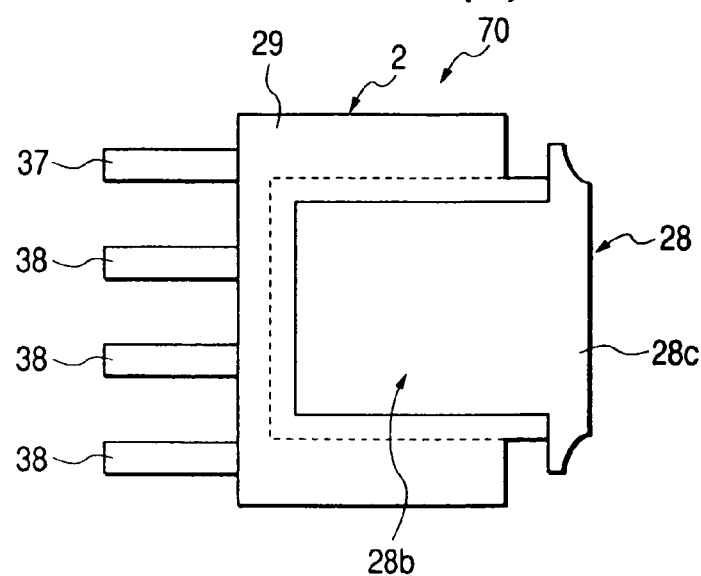

In the MOSFET 70, a header 28 is also formed with an exposed surface 28b exposed from the resin encapsulant 29 as shown in FIG. 10(c) on a bottom surface thereof or a surface which is opposite to a surface thereof bonded to a semiconductor pellet 10.

A structure of the MOSFET 70 of the present embodiment will now be described in detail.

As shown in FIGS. 9(a) through 12, the MOSFET 70 comprises:

a gate inner lead 35 electrically connected to a gate electrode pad 19 (surface electrode) as shown in FIG. 2(b) of a semiconductor pellet 10 having a field effect transistor formed on a principal surface 10a thereof and source inner leads 36 electrically connected to source electrode pads 20 (surface electrodes) as shown in FIG. 2(b);

a gate connecting portion 25 which is a protruding terminal constituted by a bump that electrically connects the gate electrode pad 19 of the semiconductor pellet 10 and a gate connecting piece 35a supporting the inner lead 35;

source connecting portions 26 which are protruding terminals constituted by bumps that electrically connect the source electrode pads 20 of the semiconductor pellet 10 and a source connecting piece 36a supporting the inner leads 36;

a resin encapsulant 29 formed by encapsulating the semiconductor pellet 10 and the inner leads 35 and 36 with resin;

an outer lead 37 connected to the inner lead 35 and protruding from one lateral surface of the resin encapsulant 29;

outer leads 38 connected to the inner leads 36 and protruding from the same lateral surface of the resin encapsulant 29 in parallel with the outer lead 37; and a header 28 bonded to a surface (back surface 10b) of the semiconductor pellet 10 opposite to the principal surface 10a with silver paste 39 which is a header bonding material (corresponding to the drain connecting portion 27 in the MOSFET 1 of the first embodiment) and having a header protruding portion 28c protruding from a lateral surface (another lateral surface) of the resin encapsulant 29 opposite to the lateral surface from which the outer leads 37 and 38 protrude.

In the MOSFET 70 of the present embodiment, since the plate-like header 28 has the header protruding portion 28c, the area of the header 28 can be significantly increased, and this makes it possible to release heat generated at the semiconductor pellet 10 through the header 28 having the header protruding portion 28c.

As a result, a further reduction of the thermal resistance of the MOSFET 70 can be achieved.

Since the area of the header 28 can be significantly increased, the electrical resistance of the same can be also reduced, which makes it possible to improve the electrical characteristics of the MOSFET 70 in cooperation with the above-described effect of reducing thermal resistance.

The source inner leads 36 are provided as three branches from the source connecting pieces 36a (inner lead coupling portion) provided in a face-to-face relationship with the principal surface 10a of the semiconductor pallet 10.

Figure 11A:
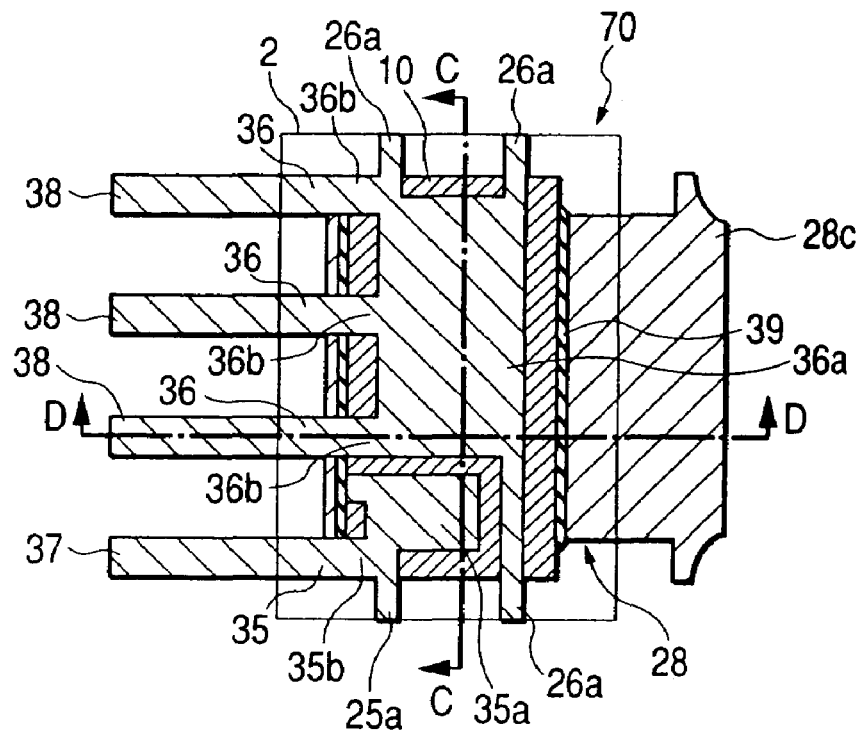
FIGS. 11(a) through 11(C) illustrate the structure of the MOSFET shown in FIGS. 9(a) and 9(b), FIG. 11(a) being a plan view showing an internal structure of the same as viewed through a resin encapsulant (package), FIG. 11(b) being a sectional view taken along the line C-C in FIG. 11(a), FIG. 11(c) being a sectional view taken along the line D-D in FIG. 11(a)
Figure 11B:
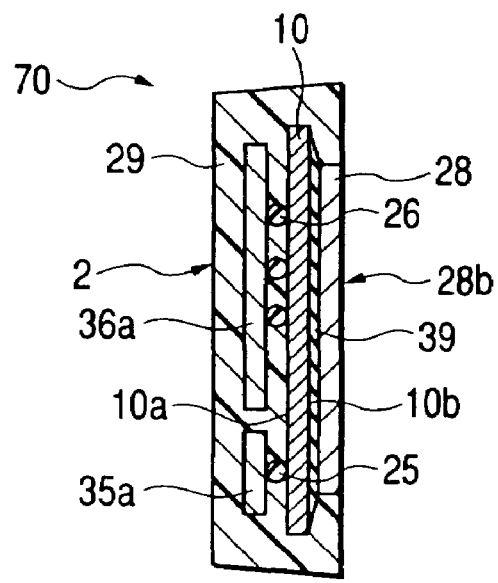
Figure 11C:
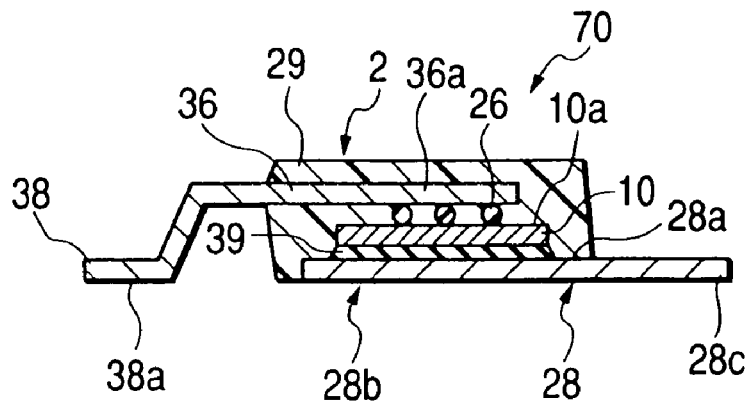
Figure 12:
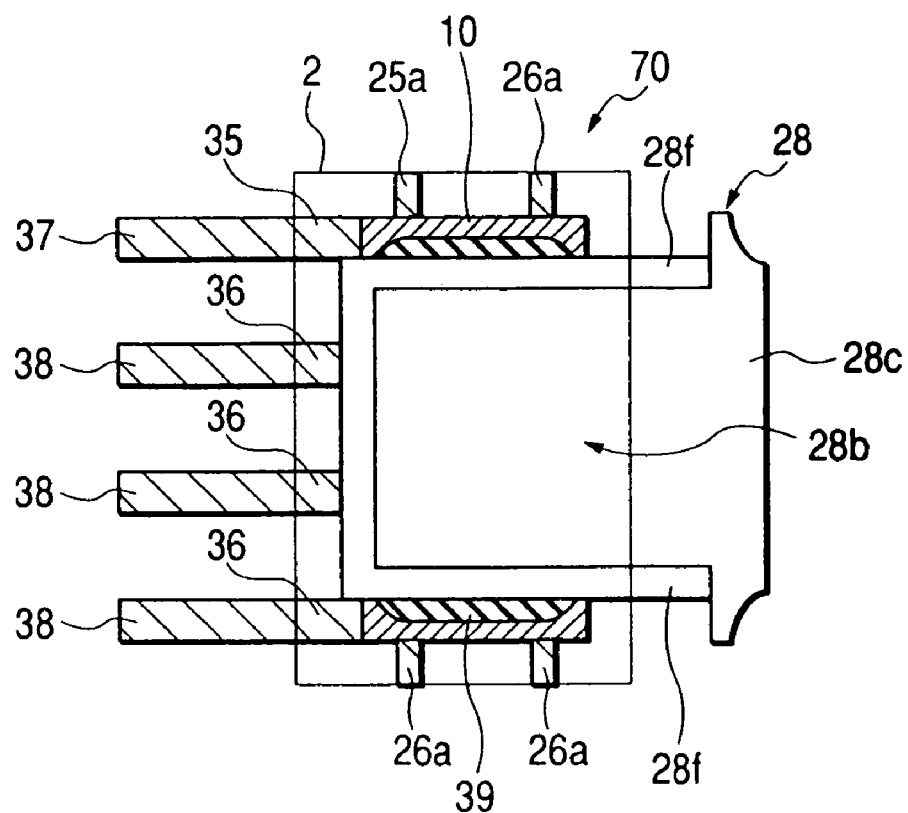
FIG. 12 is a bottom view of an internal structure of the MOSFET shown in FIGS. 9(a) and 9(b) as viewed through the resin encapsulant (package)

That is, as shown in FIG. 11(a), the inner leads 35 and 36 are respectively coupled to and supported by the gate connecting piece 35a (inner lead coupling portion) and source connecting piece 36a (inner lead coupling portion).

As a result, when the outer leads 38 connected to the inner leads 36 are cut and shaped after molding, stress exerted upon the source connecting piece 36a supporting the inner leads 36 can be dispersed and mitigated because the inner leads 36 are separate from each other.

This makes it possible to prevent the source connecting portions 26 which are protruding terminals from coming off the source connecting piece 36a which is an inner lead coupling portion to cause poor connection.

Further, since the inner leads 36 are separately supported, the inner leads 36 and the resin encapsulant 29 contact each other in a great area, which suppresses absorption of moisture into the interior of the package 2 and consequently provides the MOSFET 70 with improved anti-humidity characteristics.

Even if the source inner leads 36 are provided in the form of three branches from the source connecting piece 36a (inner lead coupling portion) provided in a face-to-face relationship with the principal surface 10a of the semiconductor pellet 10, there is only a slight increase in electrical resistance attributable to such branching, and such an increase in electrical resistance is smaller than the on resistance of the field effect transistor. Therefore, the outer leads 38 may be provided in the form of a plurality of (three) branches as in the MOSFET 70 of the present embodiment.

The MOSFET 70 is a surface-mount type device in which the surface of the header 28 opposite to the surface 28a thereof bonded to the semiconductor pellet 10 is the exposed surface 28b exposed from the resin encapsulant 29; the outer leads 37 and 38 are bent; and the exposed surface 28b of the header 28 and the mounted surfaces 37a and 38a of the outer leads 37 and 38 are at substantially the same height (which is equal or smaller than the thickness of the outer leads).

Therefore, when the MOSFET 70 is mounted on a printed circuit board 3 (see FIGS. 8(a) and 8(b)) or the like, the MOSFET 70 can be easily mounted because it can be simply transferred by means of absorption or the like unlike a semiconductor device whose outer leads must be inserted.

Figure 24A:
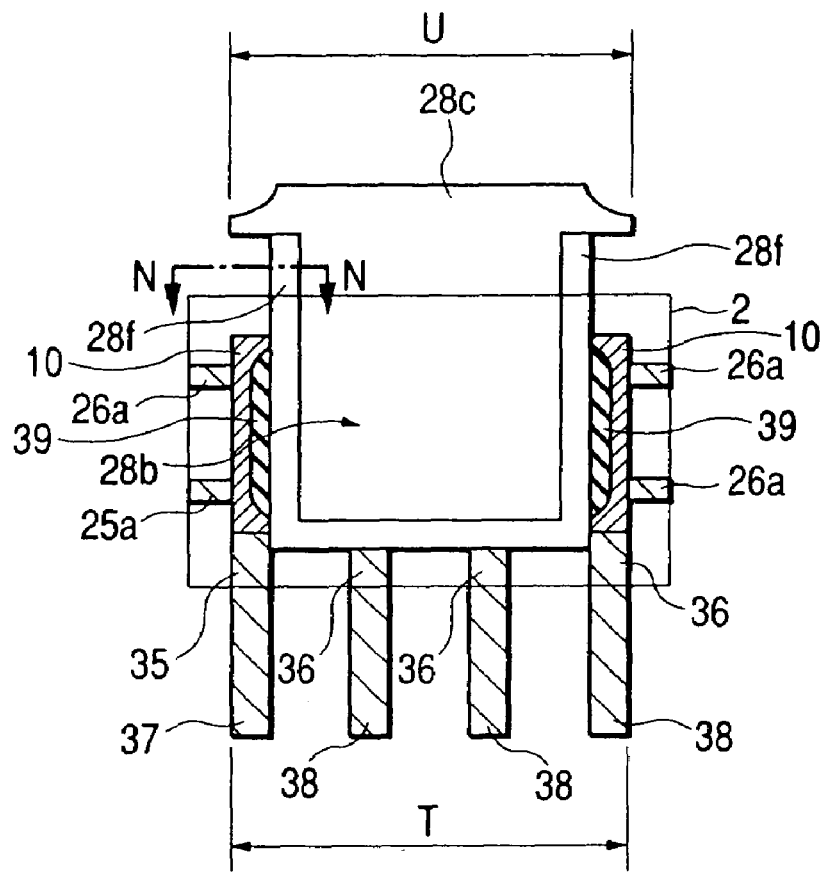
FIGS. 24(a) and 24(b) illustrate an example of a structure of a step portion of the header of the MOSFET shown in FIGS. 9(a) and 9(b), FIG. 24(a) being a plan view of the same as viewed through the resin encapsulant.

As shown in FIG. 24(a), the MOSFET 70 of the present embodiment is formed such that the distance (T) between the outer edges of the two outer leads 37 and 38 provided on both ends of the array of the plurality of outer leads 37 and 38 is substantially equal to the width (U) of the header protruding portion 28c of the header 28 in the direction in which the outer leads are arranged.

The purpose is to maintain compatibility of the device with conventional foot patterns (substrate terminals) formed on the printed circuit board 3 and, as a result, the MOSFET 70 can be mounted as it is on the printed circuit board 3 without modifying any conventional foot pattern.

Figure 24B:
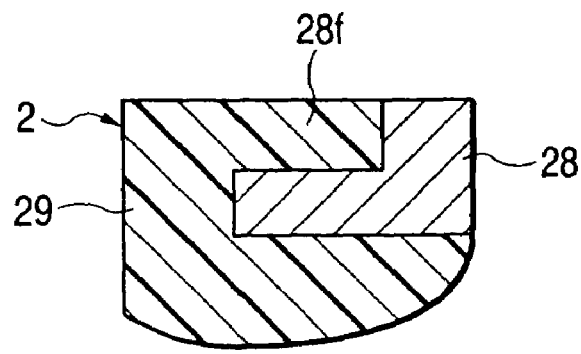

As shown in FIGS. 24(a) and 24(b), a step portion 28f is provided on the periphery of the header 28 and a part of the header protruding portion 28c (at least regions bonded to the resin encapsulant 29 including the lateral surfaces).

This makes it possible to increase the bonding area between the resin encapsulant 29 and the header 28, thereby improving the bond between them.

As a result, the occurrence of cracks on the resin encapsulant 29 can be prevented to improve the quality of the MOSFET 70.

In the MOSFET 70 of the present embodiment, the source connecting piece 36a (inner lead coupling portion) supporting the three source inner leads 36 is provided on the principal surface 10a of the semiconductor pellet 10 in a face-to-face relationship therewith, and base portions 35b and 36b of the respective inner leads 35 and 36 are provided in an inner region of the principal surface 10a of the semiconductor pellet 10.

Figure 23A:
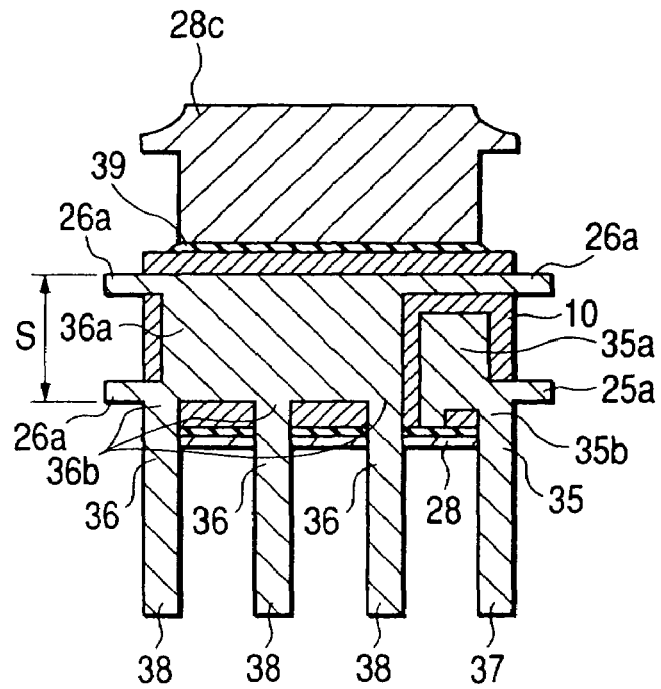
FIGS. 23(a) and 23(b) are partial plan views of an example of a method for inspecting the application of silver paste at a step of manufacturing the MOSFET shown in FIGS. 9(a) and 9(b)

As a result, when the silver paste 39 which is a header bonding material is subjected to a visual inspection before molding at a step for manufacturing the MOSFET 70, as shown in FIG. 23(a), the presence or absence of the silver paste 39 can be checked through the gaps between the adjoining inner leads.

Figure 25:
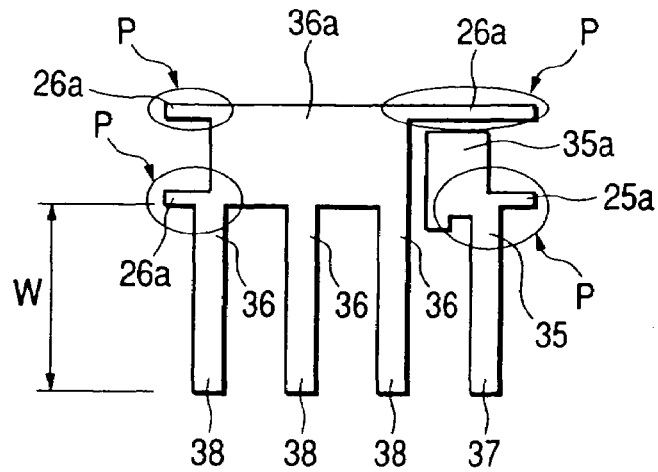
FIG. 25 is a plan view of an example of a structure of thin leads among inner leads used in the MOSFET shown in FIGS. 9(a) and 9(b)

Further, since the base portions 35b and 36b of the respective inner leads 35 and 36 are provided in an inner region of the principal surface 10a of the semiconductor pellet 10, the outer leads 37 and 38 can be formed with a great length (W) as shown in FIG. 25.

This makes it possible to mitigate any stress attributable to the bending of the outer leads 37 and 38 and to prolong the time required for moisture to penetrate to the semiconductor pellet 10 at an anti-humidity test or the like on the MOSFET 70, which allows the anti-humidity characteristics of the MOSFET 70 to be improved.

The structure of the semiconductor device (MOSFET 70) of the present embodiment and the operations and effects of the MOSFET 70 are otherwise similar to those of the first embodiment and will not be described here to avoid repetition.

A method of manufacturing the MOSFET 70 of the present embodiment will now be described with reference to the manufacturing process flow chart shown in FIG. 13.

First, a semiconductor wafer (not shown) is prepared which has field effect transistors formed in respective pellet regions.

Figure 13:
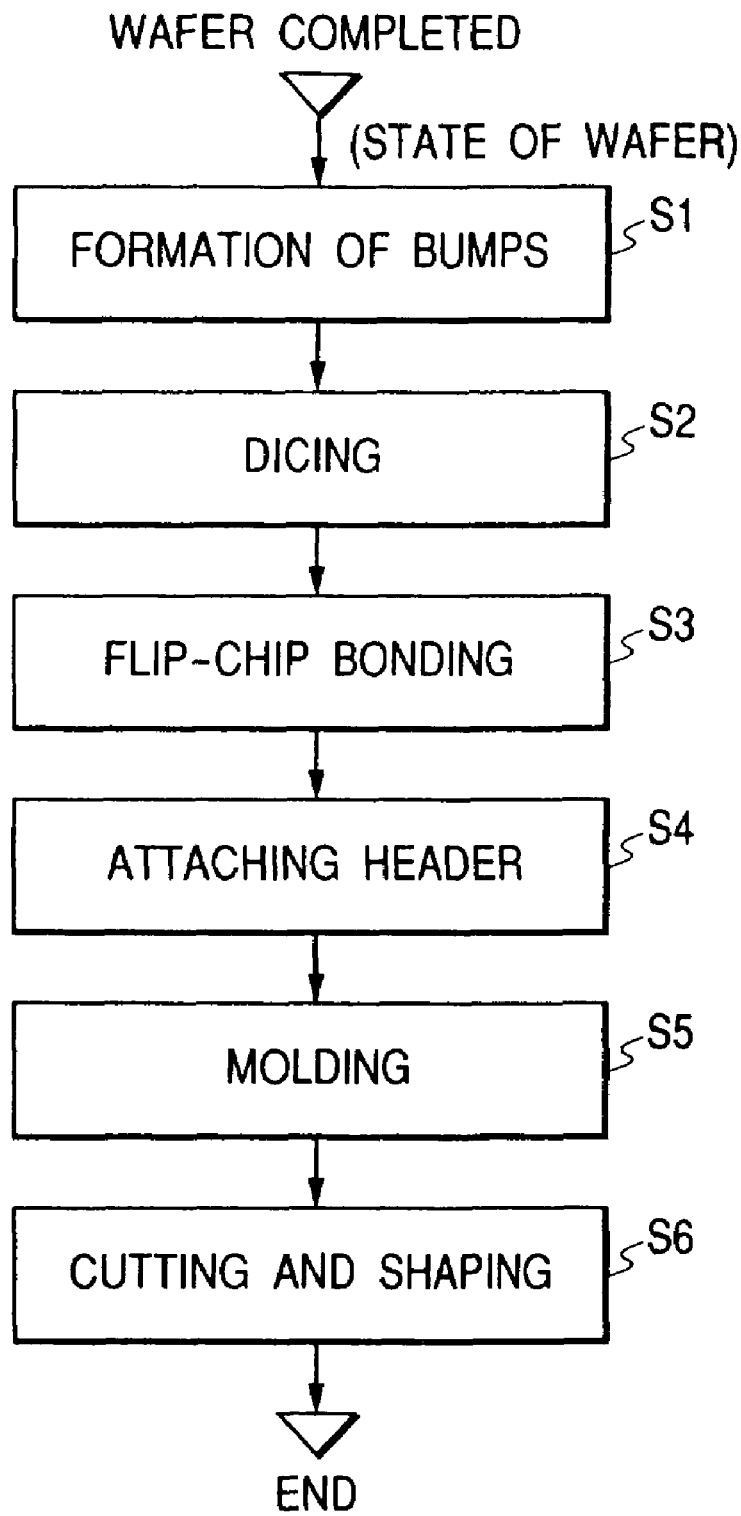
FIG. 13 is a process flow chart showing an example of steps for manufacturing the MOSFET shown in FIGS. 9(a) and 9(b)

At step S1 shown in FIG. 13, a method of forming bumps such as stud bumps is then used to respectively form a gate bump 22 and source bumps 23 on a gate electrode pad 19 and source electrode pads 20 as shown in FIGS. 2(a) and 2(b) on each semiconductor pellet 10 on the wafer.

For example, the gate bump 22 and source bumps 23 are formed from Au, solder or the like.

Figure 14:
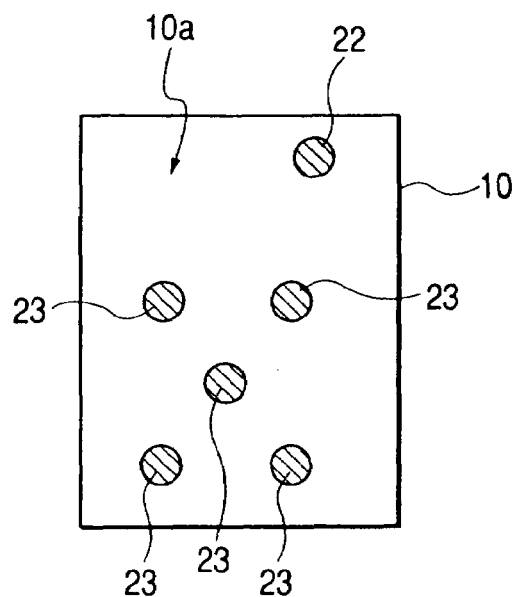
FIG. 14 is a plan view of an example of a structure of a semiconductor pellet used in the MOSFET shown in FIGS. 9(a) and 9(b)

Thereafter, dicing is performed at step S2 to cut and separate the semiconductor wafer into individual semiconductor pellets 10 having bumps formed thereon as shown in FIG. 14.

Subsequently, semiconductor pellets 10 having a field effect transistor formed on a principal surface 10a thereof are prepared.

A lead frame is also prepared which is formed by a plurality of inner leads 35 and 36 and a plurality of outer leads 37 and 38 electrically connected to the inner leads 35 and 36, respectively.

The lead frame used in the present embodiment is a multiple lead frame 30 constituted by a plurality of unit lead frames 31 each of which is a region for a single semiconductor device provided in series. In the present embodiment, the multiple lead frame 30 will be described with reference to a matrix frame 40 in which regions each serving as a single semiconductor device arranged in the form of a 2 (rows)×2 (columns) matrix are treated as one group as shown in FIG. 16.

Figure 16:
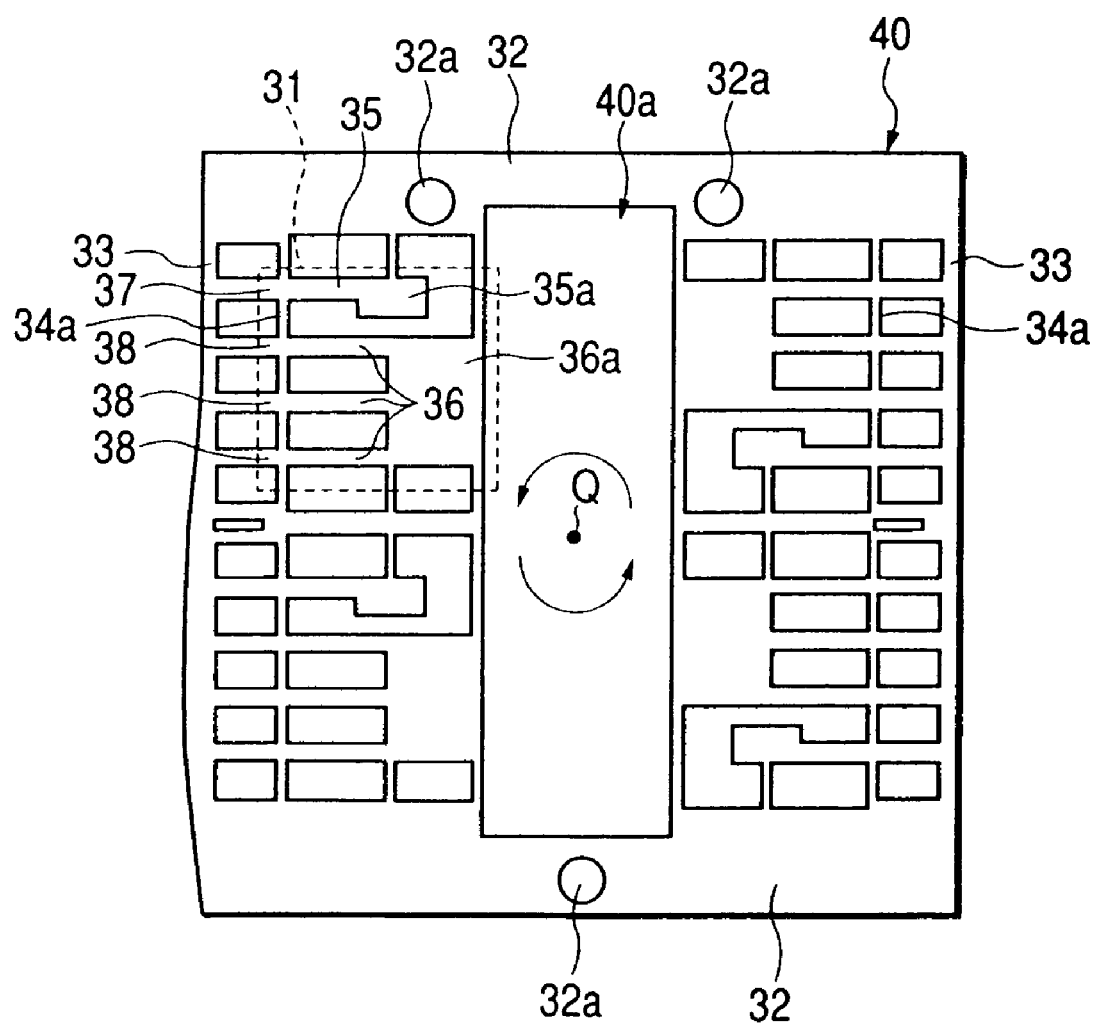
FIG. 16 is a partial plan view of an example of a structure of a matrix frame used for assembling the MOSFET shown in FIGS. 9(a) and 9(b)

The matrix frame 40 shown in FIG. 16 accommodates four MOSFETs 70 as one group.

The number of devices that form a matrix as one group supported by the matrix frame 40 is not limited to 2 (rows)×2 (columns) and they may be in any other quantity.

Since four MOSFETs 70 form one group in the matrix frame 40 shown in FIG. 16, the directions of the semiconductor pellets 10 must be reversed across a separation window 40a, and they are therefore provided in positions which are point symmetric about a point Q.

Headers 28 formed in a plate-like configuration are prepared.

Figure 15:
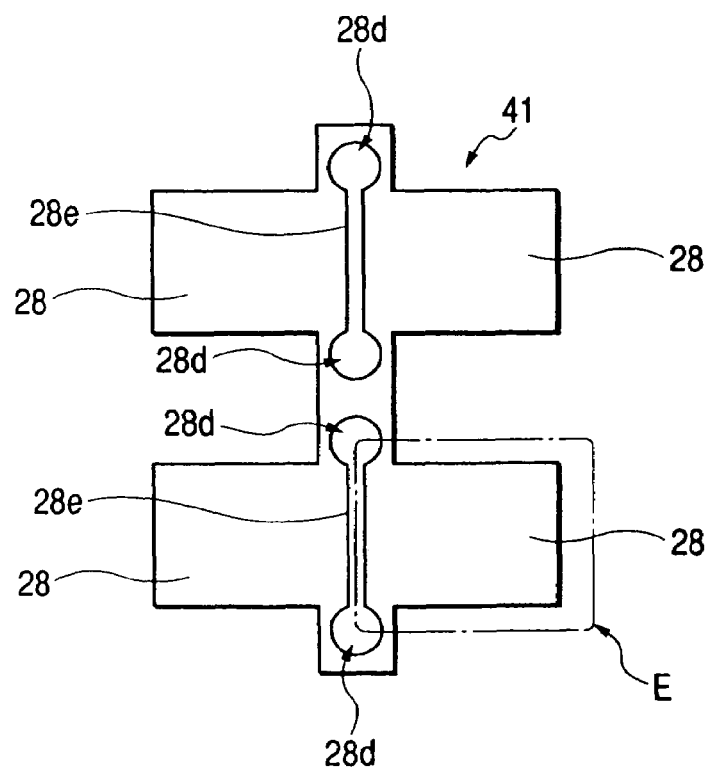
FIG. 15 is a plan view of an example of a structure of a header frame used for assembling the MOSFET shown in FIGS. 9(a) and 9(b)

According to the method of manufacturing the MOSFET 70 of the present embodiment, since four MOSFETs 70 are manufactured as one group, a header frame 41 as shown in FIG. 15 is used in which four headers 28 associated with four MOSFETs 70 are integrally provided in a 2 (rows)×2 (columns) configuration. Therefore, when the headers 28 are bonded to the semiconductor pellets 10, the four integral headers 28 are bonded to the four respective semiconductor pellets 10 at one time (the header 28 in the region E in FIG. 15 represents a header 28 used for one MOSFET 70).

One header frame 41 is provided with four round holes 28d used for locating it on a guide of a header mounting device (not shown) during the mounting of the header, and each of pairs of round holes 28d is in communication to a slit 28e.

According to the procedure for manufacturing the MOSFETs 70, a header 28 can not be provided in the absence of the semiconductor pellet 10 on the matrix frame 40, and the absence of the header 28 results in the leakage of resin at the molding step because of the structure of the upper die 51 and lower die 52 of the molding apparatus, which necessitates cleaning of the upper die 51 and lower die 52 after each shot of molding.

It is therefore unpreferred to manufacture the MOSFETs 70 using a header 28 having a structure to support only a single device or two headers 28 in an integral structure, and it is preferable to manufacture the MOSFETs 70 using a header frame 41 having four integral headers 28 as in the present embodiment.

Further, the use of the header frame 41 having four integral headers 28 provides better throughput compared to the use of a header 28 having a structure to support only a single device or two headers 28 in an integral structure.

A possible alternative to the header frame 41 is a frame having a structure in which three headers 28 are coupled in a row like a header frame 42 of a comparative example shown in FIG. 27(a). In this case, however, since the headers 28 can incline as shown in FIG. 27(b) because of the weight of the headers 28 when the pellet size is small, such a header frame 42 in which three headers 28 are arranged in a row is also unpreferred.

Thereafter, flip-chip bonding is carried out at step S3 to bond the semiconductor pellets 10 to the matrix frame 40.

Figure 17A:
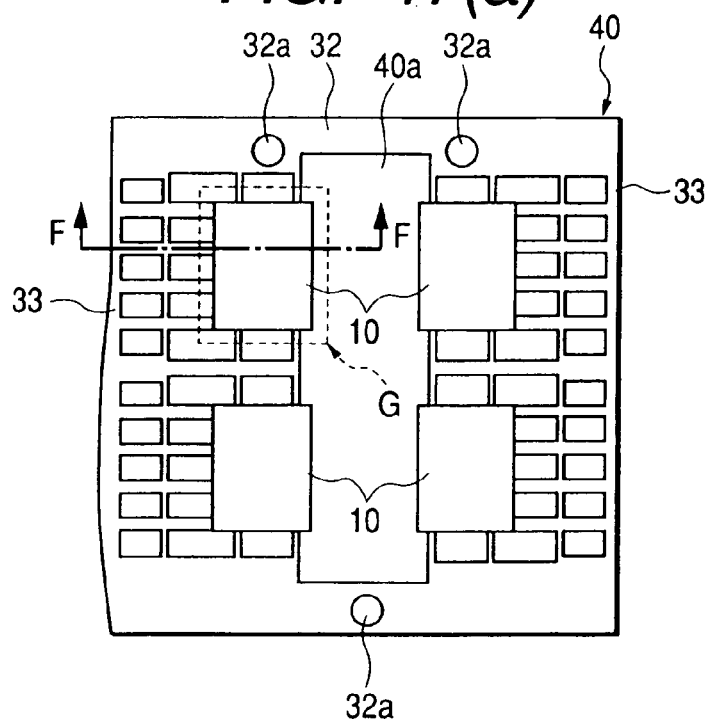
FIGS. 17(a) through 17(c) illustrate an example of a structure for the packaging of a flip-chip at a step of manufacturing the MOSFET shown in FIGS. 9(a) and 9(b), FIG. 17(a) being partial plan view of the same, FIG. 17(b) being a sectional view taken along the line F-F in FIG. 17(a), FIG. 17(c) being a partial bottom view of the region G in FIG. 17(a) as viewed from the side of leads.
Figure 17B:
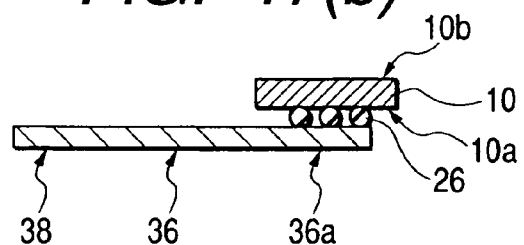

As shown in FIGS. 17(a) and 17(b), each of the back surfaces 10b of the four semiconductor pellets 10 is directed upward; the four semiconductor pellets 10 are located on the gate connecting pieces 35a and source connecting pieces 36a of the respective semiconductor device regions of the matrix frame 40; and the pellets are bonded on a thermocompression basis.

Specifically, the gate connecting pieces 35a supporting the inner leads 35 and the gate electrode pads 19 (see FIG. 2(b)) of the semiconductor pellets 10 are bonded with the gate connecting portions 25 by performing thermo-compression bonding of he gate bumps 22 (protruding terminals)

mounted on the gate electrode pads 19, which establishes electrical connection between the gate electrode pads 19 and inner leads 35 through the gate bumps 22 and gate connecting pieces 35a.

Similarly, the source connecting pieces 36a supporting the inner leads 36 and the source electrode pads 20 (see FIG. 2B) of the semiconductor pellets 10 are bonded with the source connecting portions 26 by performing thermo-compression bonding of the source bumps 23 (protruding terminals) mounted on the source electrode pads 20, which establishes electrical connection between the source electrode pads 20 and inner leads 36 through the source bumps 23 and source connecting pieces 36a.

Figure 17C:
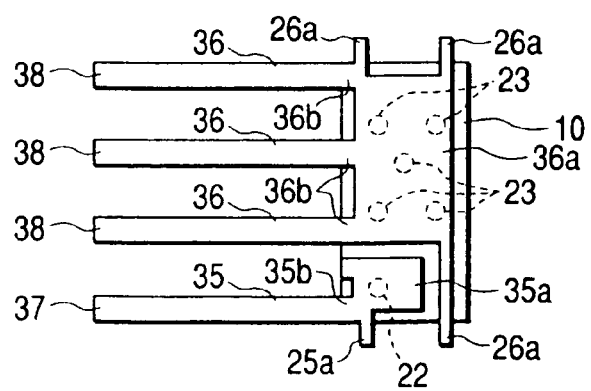
Figure 18A:
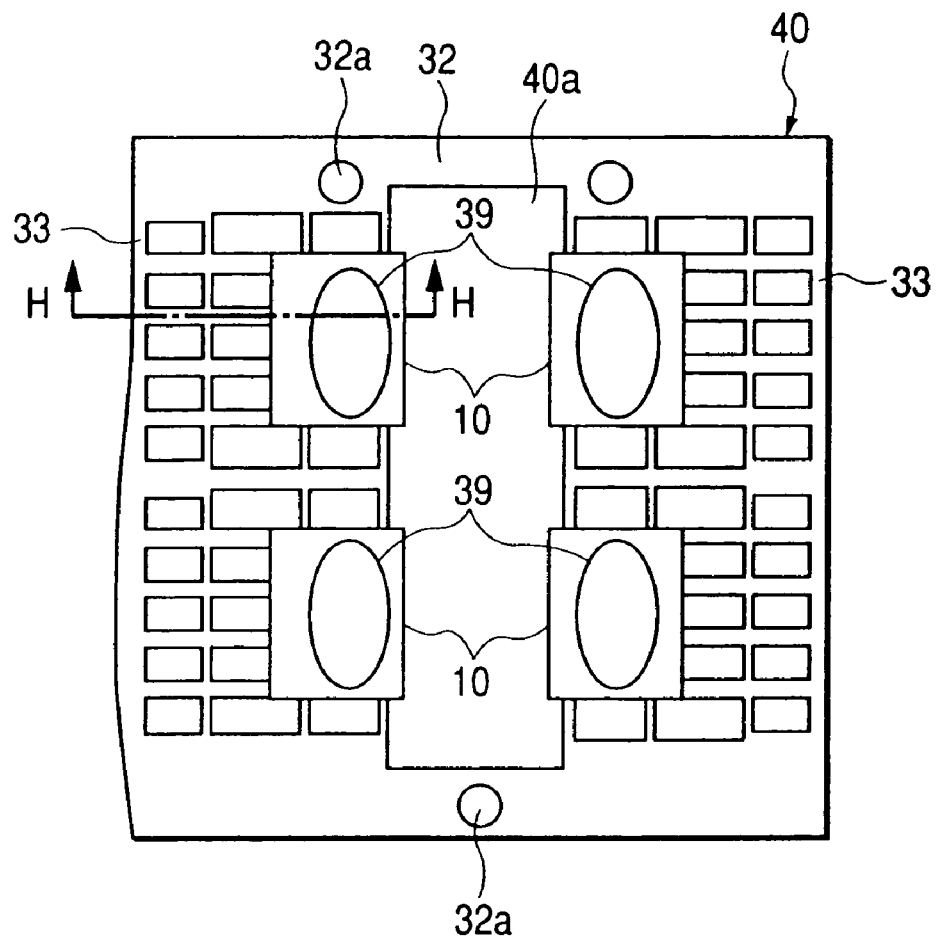
FIGS. 18(a) and 18(b) illustrate an example of a structure for the application of silver paste at a step of manufacturing the MOSFET shown in FIGS. 9(a) and 9(b), FIG. 18(a) being a partial sectional view of the same, FIG. 18(b) being a sectional view taken along the line H-H in FIG. 18(a)
Figure 18B:
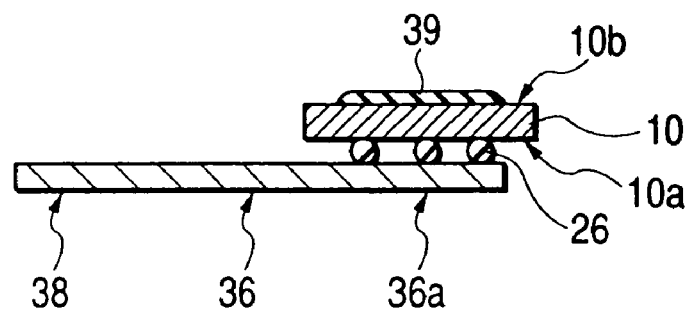

The state shown in FIGS. 17(a) through 17(c) shows a structure at a stage immediately before the thermo-compression bonding, and the thermo-compression bonding turns the source bumps 23 shown in FIG. 17(b) into the source connecting portions 26 as shown in FIG. 18(b).

The gate bumps 22 and source bumps 23 may be attached to the inner leads 35 and 36, respectively.

The positional relationship between the principal surfaces 10a of the semiconductor pellets 10 and the gate connecting pieces 35a and source connecting pieces 36a after the flip-chip mounting is as shown in FIG. 17(c).

Specifically, in a MOSFET 70 of the present embodiment, the source connecting piece 36a (inner lead coupling portion) supporting the three source inner leads 36 is provided on the principal surface 10a of the semiconductor pellet 10 in a face-to-face relationship therewith, and the base portions 36b of the inner leads 36 are located on an inner region of the principal surface 10a of the semiconductor pellet 10.

Further, the gate connecting piece 35a supporting one gate inner lead 35 is also provided on the principal surface 10a of the semiconductor pellet 10 in parallel with the source connecting piece 36a in electrical isolation from the same, and the base portion 35b of the inner lead 35 is also located in an inner region of the principal surface 10a of the semiconductor pellet 10.

Next, header mounting is performed (step S4), i.e., the headers 28 are mounted to the semiconductor pellets 10.

As shown in FIGS. 18(a) and 18(b), the silver paste 39 which is a header bonding material is first applied to the back surface 10b of each of the semiconductor pellets 10.

Figure 19A:
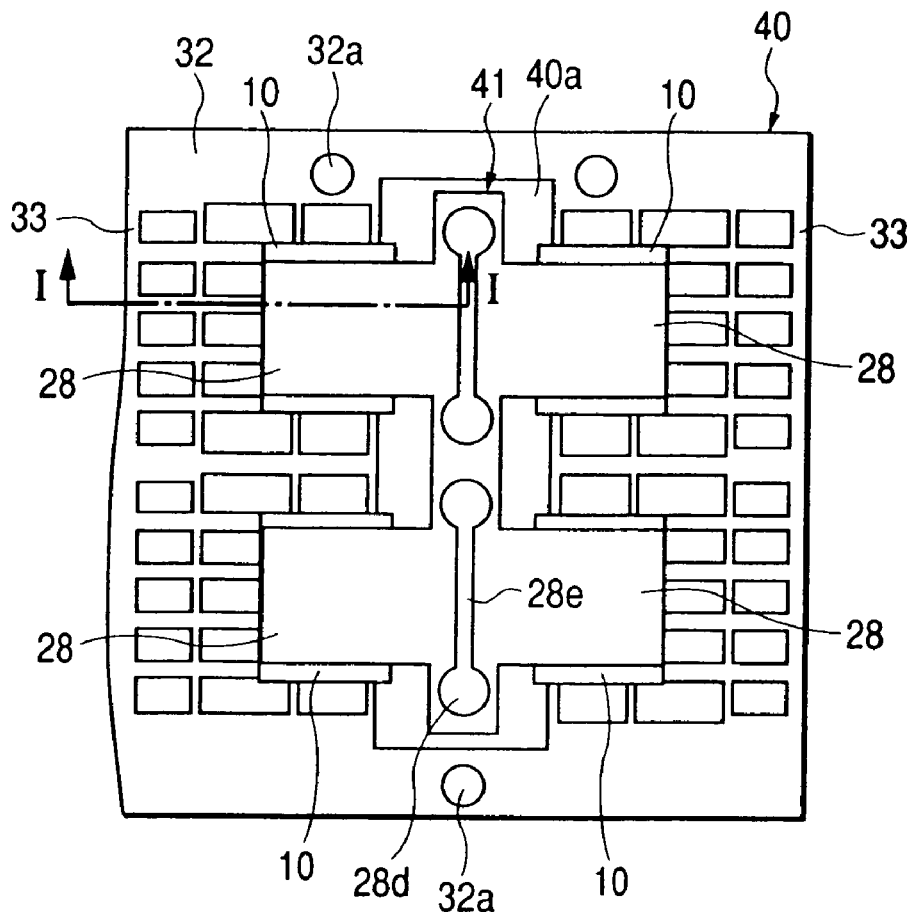
FIGS. 19(a) and 19(b) illustrate an example of a structure for attaching a header at a step of manufacturing the MOSFET shown in FIGS. 9(a) and 9(b), FIG. 19(a) being a partial sectional view of the same, FIG. 19(b) being a sectional view taken along the line I-I in FIG. 19(a)
Figure 19B:
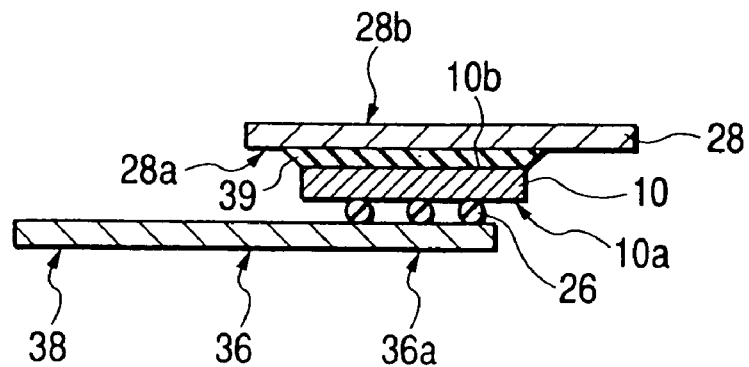

Subsequently, as shown in FIGS. 19(a) and 19(b), the headers 28 on the header frame 41 are placed on the back surfaces 10b of the four semiconductor pellets 10, Further, the semiconductor pellets 10 are pressed, and scrubbing or the like is performed to bond the headers 28 to the back surfaces 10b of the respective semiconductor pellets 10 with the silver paste 39.

At this stage, as shown in FIG. 23(a), a visual inspection is carried out to check the presence or absence of the silver paste 39 which is a header bonding material through the gaps between the adjoining inner leads or from the side of the source connecting piece 36a opposite to the side where the inner leads are provided, and wettability of the silver paste 39 is inspected.

Since the width S of the source connecting piece 36a shown in FIG. 23(a) is smaller than the width of the semiconductor pellet 10 associated therewith, it is checked whether the silver paste 39 has swelled out or not from the semiconductor pellet 10, and the inspection gives a pass when it has swelled out.

Figure 23B:
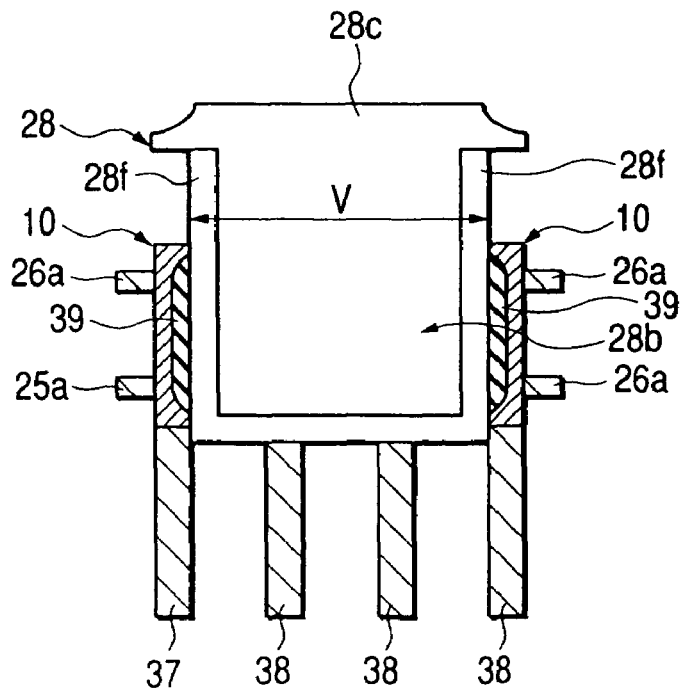

Further, as shown in FIG. 23(b), the silver paste 39 is visually inspected from both of the sides of the headers 28 in the same direction in which the outer leads are arranged with the matrix frame 40 inverted. Thus, the silver paste 39 is visually inspected from the both of the above-described sides of the headers 28 and, if the silver paste 39 is visible, the silver paste 39 is passed in terms of wettability.

Since the width (V) of the header 28 in the same direction as the arranging direction of the outer leads is smaller than the length of the semiconductor pellet 10 in the same direction as shown in FIG. 23(b), it is checked whether the silver paste 39 has swelled out from the header 28.

By forming the source connecting piece 36a and gate connecting piece 35a smaller than the semiconductor pellet 10, stress exerted upon the semiconductor pellet 10 can be mitigated when the MOSFET 70 is mounted on a printed circuit board 3 (see FIGS. 8(a) and 8(b)) using a reflow process.

Thereafter, molding is performed at step S5 as shown in FIG. 13.

Figure 20A:
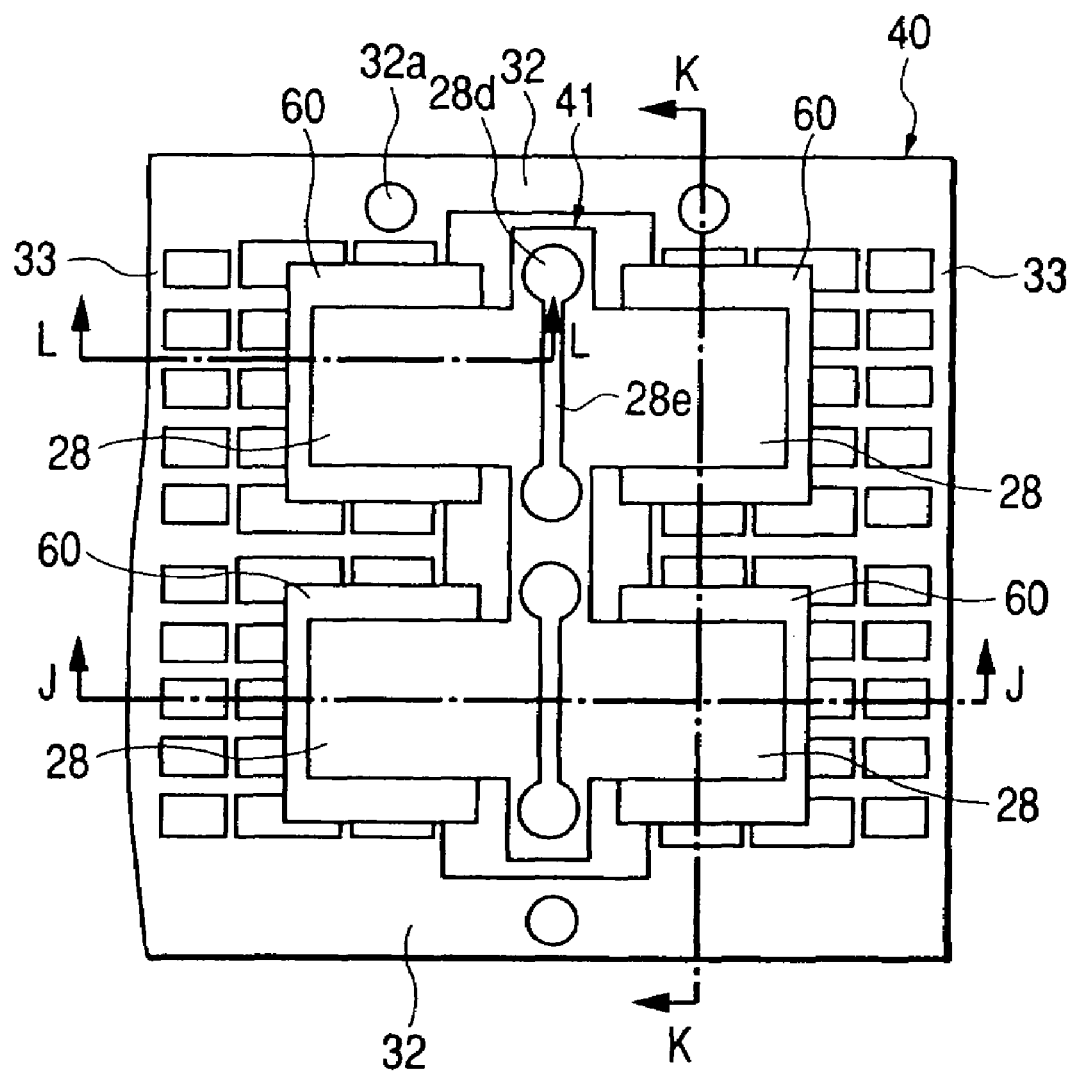
FIGS. 20(a) through 20(c) illustrate an example of a structure for molding at a step of manufacturing the MOSFET shown in FIGS. 9(a) and 9(b), FIG. 20(a) being a partial plan view of the interior of the molding die as viewed through the molding die, FIG. 20(b) being a partial sectional view taken along the line J-J in FIG. 20(a) when the molding die is clamped, FIG. 20(c) being a partial sectional view taken along the line K-K in FIG. 20(a) when the molding die is clamped.
Figure 20B:
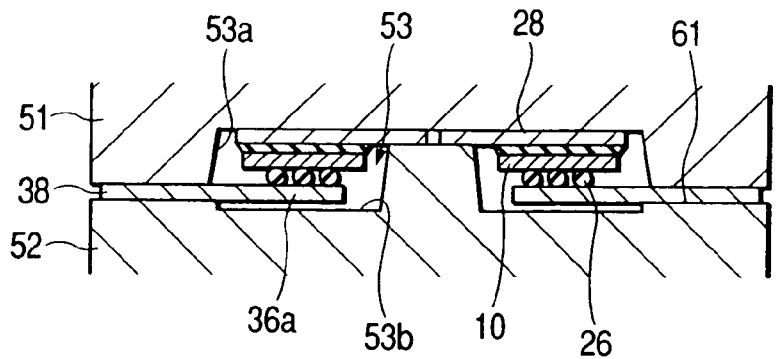
Figure 20C:
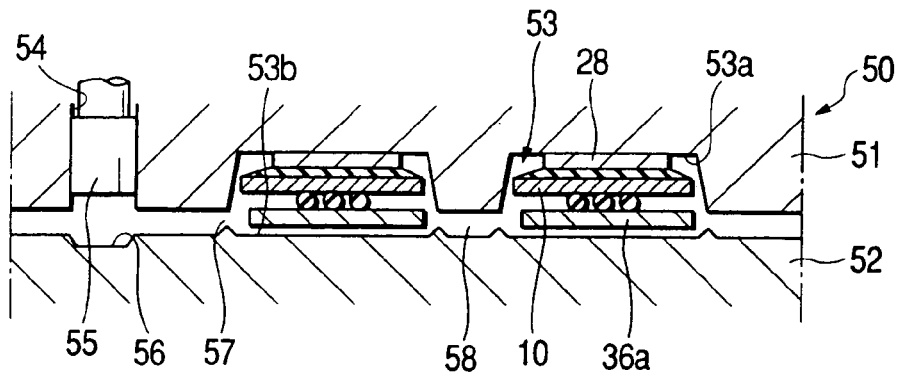

As shown in FIGS. 20(a), 20(b) and 20(c), the semiconductor pellets 10, inner leads and headers 28 are located in the cavities 53 of the upper die 51 and lower die 52 which are in turn clamped in such a state, and the resin 60 is then injected into the cavities 53 to perform resin encapsulation (molding).

Since the header frame 41 has a 2×2 configuration in association with the cavities 53, the leakage of resin from the cavities 53 can be prevented even if any of the semiconductor pellets 10 drops after flip-chip mounting.

Figure 21:
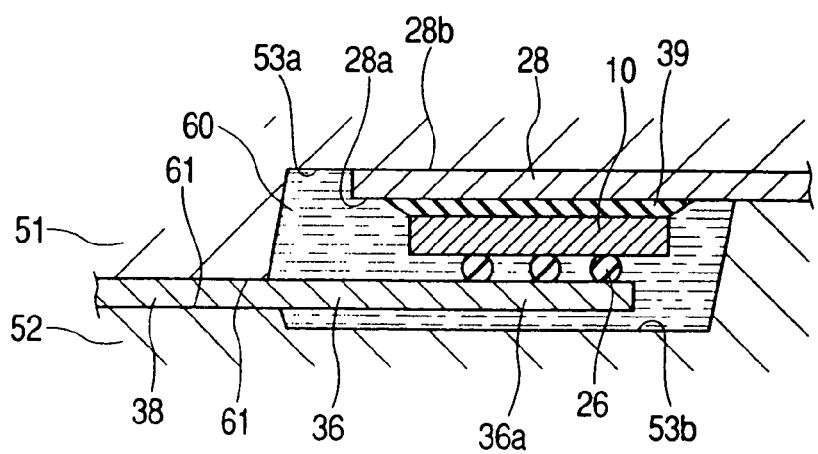
FIG. 21 is an enlarged partial sectional view taken along the line L-L in FIG. 20(a) when the molding die is clamped.

Since resin is injected with the exposed surface 28b of the header 28 in tight contact with the bottom of the cavity of the upper die 51 as shown in FIG. 21, the surface of the header 28 opposite to the surface 28a thereof bonded to the semiconductor pellet 10, i.e., the exposed surface 28b can be exposed from the resin encapsulant 29 after the resin is set. In addition, the resin encapsulant 29 can be formed with the header protruding portion 28c protruding in the direction opposite to the protruding direction of the outer leads 37 and 38.

Figure 22A:
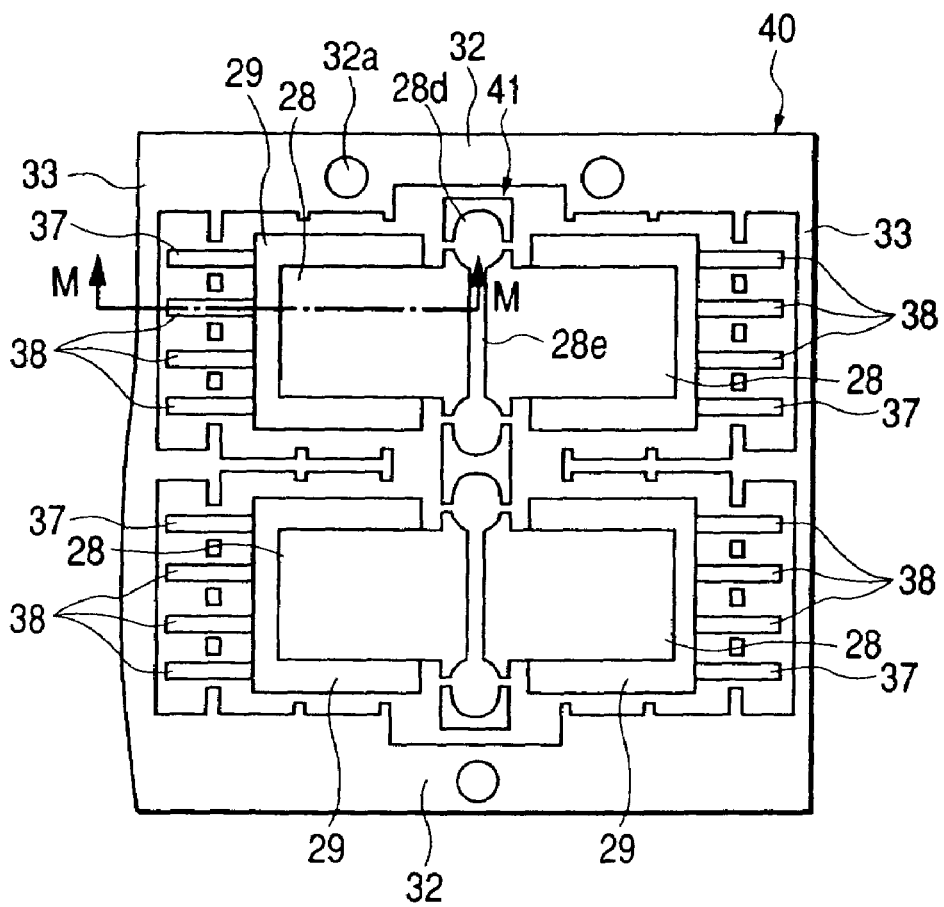
FIGS. 22(a) and 22(b) illustrate an example of a structure for cutting and shaping at a step of manufacturing the MOSFET shown in FIGS. 9(a) and 9(b), FIG. 22(a) being a partial plan view of the same, FIG. 22(b) being a sectional view taken along the line M-M in FIG. 22(a)

Thereafter, as shown in FIG. 22(a), cutting and shaping (step S6) is performed to cut off the plurality of outer leads 37 and 38 from the matrix frame 40 and to bend the same.

At the same time, the integrated header frames 41 are cut at the respective round holes 28d and are separated into four headers 28 along the slits 28e.

Figure 22B:
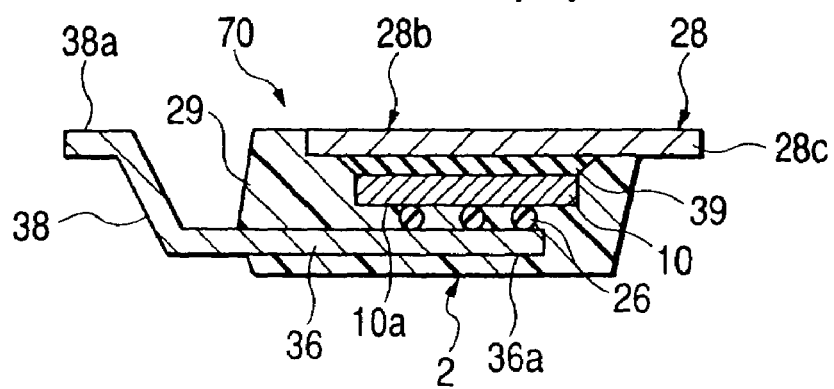

At this cutting and shaping step, the outer leads 37 and 38 are bent into a gull wing configuration as shown in FIG. 22(b).

The source connecting piece 36a and gate connecting piece 35a are provided on the principal surface 10a of the semiconductor pellet 10, and the base portions 35b and 36b of the respective inner leads 35 and 36 supported thereby are also located on the principal surface 10a. It is therefore possible to reduce stress exerted upon the gate connecting portion 25 and source connecting portion 26 which are bump bonding portions when the outer leads are bent.

Further, since the gate connecting piece 35a and source connecting piece 36a are respectively provided with thin leads 25a and 26a as represented in the region P in FIG. 25, the thin leads 25a and 26a are expanded when the outer leads are cut to mitigate stress exerted upon the gate connecting portion 25 and source connecting portion 26 which are the bump bonding portions.

This makes it possible to mitigate bending stress exerted upon the bump bonding portions when the outer leads are cut and shaped.

Thus, the manufacture of the MOSFETs 70 is terminated.

During the manufacture of the MOSFETs 70, they are transferred between steps starting with the step S3 of flip-chip bonding up to the step S6 of cutting and shaping with the exposed surfaces 28b of the headers 28 facing upward.

There is another method of manufacturing the semiconductor device (MOSFET 70) of the present embodiment which is similar to the above-described method of manufacturing the MOSFET 1 of the first embodiment and which will not therefore be described here again.

In addition, other effects achieved by the method of manufacturing the MOSFET 70 according to the present embodiment are the same as those described in relation to the first embodiment and will not therefore be described here again.

While the invention conceived by the inventor has been specifically described with reference to preferred embodiments of the same, the invention is not limited to the embodiments and may obviously be modified in various ways without departing from the principle of the invention.

Figure 26:
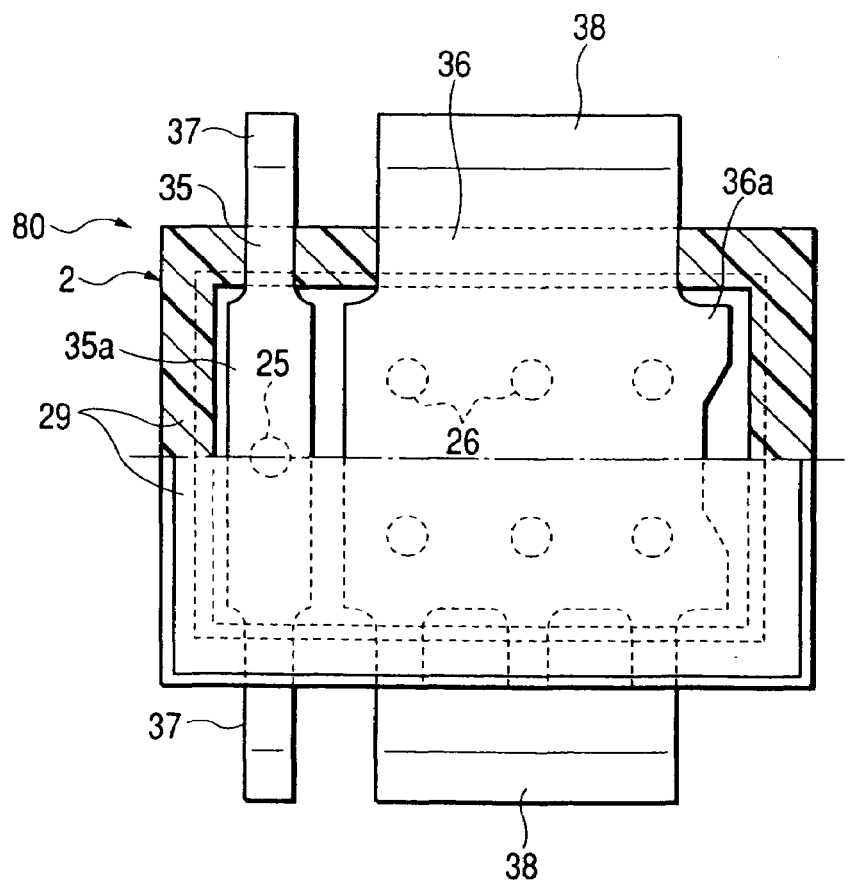
FIG. 26 is a partially cutaway plan view of a structure of a modification of a MOSFET according to the invention.

For example, while the first and second embodiments have referred to cases wherein the source outer lead 38 is in the form of a plurality of branches each of which is formed with substantially the same width as the gate outer lead 37, as seen in a modified MOSFET 80 shown in FIG. 26, source outer leads 38 provided on both sides of a resin encapsulant 29 may be integrally formed to provide a width greater than that of a gate outer lead 37.

This makes it possible to achieve a reduction of electrical resistance (e.g., about 0.1 mΩ), thereby improving the electrical and radiating characteristics of the MOSFET 80 consequently.

The bumps (gate bumps 22 and source bumps 23) may be disposed on the inner leads instead of being limited to the semiconductor pellet. The formation of the bumps is not limited to the SSB process, and they may be formed using a plating process. The bumps is not limited to gold and may be formed from solder or the like.

The semiconductor pellet 10 and header 28 are not limited to connection using a conductive bonding material such as silver paste and may be connected by means of soldering or may alternatively be connected using a gold-tin eutectic layer or the like. It is preferable to select a material having preferable electrical and thermal conductivity in consideration to the conductivity and heat radiation from the semiconductor pellet 10 to the header 28.

In addition, it is not limiting the invention to connect the drain electrode pad 21 to the header 28, and the source electrode pad 20 may alternatively connected thereto.

Moreover, the invention is not limited by the connection of the header 28 to the semiconductor pellet 10 after the bonding of the inner leads, and the header 28 may be connected to the semiconductor pellet 10 before or simultaneously with the bonding of the inner leads.

The shape, size, structure and the like of the header 28 are preferably selected so as to satisfy various conditions including required radiating performance and the performance, size, shape and structure of the semiconductor pellet 10.

The invention is not limited to the use of a copper type material as the material for forming the header 28, and other metal materials such as aluminum type materials having preferable thermal conductivity may be used instead.

The invention may be applied to IGBTs (insulating gate bipolar transistors) and transistor packages having three-terminals such as high output bipolar transistors.

INDUSTRIAL APPLICABILITY

As described above, the semiconductor device and the method of manufacturing the same according to the invention are suitable for MOSFETs, are preferably incorporated in portable apparatuses such as portable telephones and portable personal computers and are suitable for power MOSFETs incorporated in thin portable apparatuses and the like.

The invention claimed is:

1. A semiconductor device, comprising:
   a semiconductor chip including a MOSFET, said semiconductor chip having a main surface and a back surface opposite to said main surface, and said semiconductor chip having gate and source electrodes of the MOSFET disposed on said main surface and a drain electrode of the MOSFET disposed on said back surface;
   a gate lead having an inner lead and an outer lead which is continuous with said inner lead, said inner lead of said gate lead having a first portion which is disposed on said main surface of said semiconductor chip and being electrically connected to said gate electrode;
   a source lead having an inner lead and a plurality of outer leads which are continuous with said inner lead, said inner lead of said source lead having a first portion which is disposed on said first main surface of said semiconductor chip and being electrically connected to said source electrode, said outer leads extending from said first portion of said source lead;
   a drain lead of a plate shape being disposed on said back surface of said semiconductor chip and being electrically connected to said drain electrode, said drain lead having a first portion and a second portion which is continuous with said first portion, and said second portion overlapping said semiconductor chip in a plan view; and
   a resin member having a first pair of opposed side surfaces extending in a first direction and a second pair of opposed side surfaces extending in a second direction perpendicular to said first direction, said resin member sealing said semiconductor chip and said inner leads of said gate and source leads;
   wherein said outer leads of said gate and source leads protrude outwardly from a first side surface of said second pair of opposed side surfaces of said resin member and extend in said first direction;
   wherein said first portion of said drain lead extends outwardly from a second side surface of said second pair of opposed side surfaces of said resin member, said second portion of said drain lead is partially covered with the resin member, and a rear surface of said second portion is exposed from said resin member;
   wherein said outer leads of said gate and source leads are bent downwardly toward said drain lead;
   wherein rear surfaces of said gate and source leads and said rear surface of said drain lead are in a same level;
   wherein a width in the second direction of an outside edge portion of said drain lead outside of the resin member is than that of said second portion of said drain lead.

2. A semiconductor device according to claim 1, wherein said inner leads of said gate and source leads are respectively connected with said gate and source electrodes of said semiconductor chip via bump electrodes.

3. A semiconductor device according to claim 1, wherein said semiconductor device is a surface mount device.

* * * * *